(12) United States Patent
Kim et al.

(10) Patent No.: US 12,219,845 B2
(45) Date of Patent: Feb. 4, 2025

(54) DISPLAY APPARATUS COMPRISING PLURALITY OF FIRST CAPPING LAYERS SPACES APART FROM EACH OTHER AND METHOD OF MANUFACTURING THE SAME

(71) Applicant: Samsung Display Co., Ltd., Yongin-si (KR)

(72) Inventors: Sanghoon Kim, Yongin-si (KR); Jongsung Park, Yongin-si (KR); Sangmin Yi, Yongin-si (KR); Sangshin Lee, Yongin-si (KR); Seungjin Lee, Yongin-si (KR); Eunjoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 237 days.

(21) Appl. No.: 17/544,831

(22) Filed: Dec. 7, 2021

(65) Prior Publication Data
US 2022/0216273 A1 Jul. 7, 2022

(30) Foreign Application Priority Data

Jan. 6, 2021 (KR) ........................ 10-2021-0001466

(51) Int. Cl.
*H10K 59/35* (2023.01)
*H10K 50/80* (2023.01)
*H10K 71/00* (2023.01)

(52) U.S. Cl.
CPC .......... *H10K 59/353* (2023.02); *H10K 50/80* (2023.02); *H10K 71/00* (2023.02)

(58) Field of Classification Search
None
See application file for complete search history.

(56) References Cited

U.S. PATENT DOCUMENTS

| 8,330,352 | B2 | 12/2012 | Sung et al. | |
| 9,202,848 | B2 | 12/2015 | Kim et al. | |
| 9,997,708 | B2 | 6/2018 | Kim et al. | |
| 2009/0121983 | A1* | 5/2009 | Sung | H10K 59/352 |
| | | | | 345/76 |
| 2016/0155416 | A1* | 6/2016 | Lee | G09G 3/2003 |
| | | | | 345/690 |
| 2016/0240589 | A1* | 8/2016 | Jeong | H10K 50/858 |
| 2019/0355793 | A1* | 11/2019 | Oh | H10K 59/8731 |

FOREIGN PATENT DOCUMENTS

| KR | 10-0721942 | 5/2007 |
| KR | 10-1479994 | 1/2015 |
| KR | 10-2017-0086160 | 7/2017 |
| KR | 10-2042534 | 11/2019 |
| KR | 10-2131965 | 7/2020 |

* cited by examiner

*Primary Examiner* — Daniel Whalen
(74) *Attorney, Agent, or Firm* — Lewis Roca Rothgerber Christie LLP

(57) ABSTRACT

A display apparatus includes: a substrate having a plurality of first group areas spaced apart from each other; a first pixel electrode and a second pixel electrode in each of the plurality of first group areas; a first intermediate layer on the first pixel electrode; a second intermediate layer on the second pixel electrode; an opposite electrode on the first intermediate layer and the second intermediate layer; and a plurality of first capping layers on the opposite electrode and spaced apart from each other to correspond to the plurality of first group areas.

22 Claims, 24 Drawing Sheets

DISPLAY APPARATUS COMPRISING PLURALITY OF FIRST CAPPING LAYERS SPACES APART FROM EACH OTHER AND METHOD OF MANUFACTURING THE SAME

CROSS-REFERENCE TO RELATED APPLICATION

The present application claims priority to and the benefit of Korean Patent Application No. 10-2021-0001466, filed on Jan. 6, 2021, in the Korean Intellectual Property Office, the entire disclosure of which is incorporated herein by reference.

BACKGROUND

1. Field

Aspects of one or more embodiments relate to a display apparatus and a method of manufacturing the same.

2. Description of the Related Art

Display apparatuses are configured to display data visually or graphically. Display apparatuses may be used as displays for small products such as mobile phones or large products such as televisions.

Display apparatuses may generally include a substrate partitioned into a display area and a non-display area, and a gate line and a data line are insulated from each other in the display area. A plurality of pixel areas are generally defined in the display area, and pixels in each of the pixel areas receive electric signals from the gate line and the data line crossing each other and emit light so as to display an image to the outside. A thin-film transistor and a pixel electrode electrically connected to the thin-film transistor are provided in each of the pixel areas, and an opposite electrode may be provided (e.g., as a common electrode) in each of the pixel areas. In a non-display area, various lines configured to transmit electrical signals to pixels in the display area, pads connectable to a gate driver, a data driver, and a controller, and the like may be provided.

Recently, the various uses of display apparatuses has become more diversified. Also, display apparatuses have become relatively thinner and more lightweight, and thus, the potential uses for display apparatuses has expanded. Accordingly, studies have been actively conducted into the production of display apparatuses, and various attempts have been made to reduce additional facilities and increase yield.

The above information disclosed in this Background section is only for enhancement of understanding of the background and therefore the information discussed in this Background section does not necessarily constitute prior art.

SUMMARY

One or more embodiments include a display apparatus and a method of manufacturing the same, in which costs and manufacturing operations may be reduced by reducing the number of deposition masks compared to alternative manufacturing methods. However, this is merely an example, and the scope of embodiments according to the present disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate in which a plurality of first group areas apart from each other are defined, a first pixel electrode and a second pixel electrode in each of the plurality of first group areas, a first intermediate layer on the first pixel electrode, a second intermediate layer on the second pixel electrode, an opposite electrode on the first intermediate layer and the second intermediate layer, and a plurality of first capping layers on the opposite electrode and apart from each other to correspond to the plurality of first group areas.

According to some embodiments, the first pixel electrode may be provided with a plurality of first pixel electrodes, the second pixel electrode may be provided with a plurality of second pixel electrodes, and the plurality of first pixel electrodes and the plurality of second pixel electrodes may be alternately arranged.

According to some embodiments, a plurality of second group areas apart from each other may be further defined in the substrate, and the display apparatus may further include a third pixel electrode in each of the plurality of second group areas, a plurality of third intermediate layers on the third pixel electrode and apart from each other to correspond to the plurality of second group areas, and a second capping layer on the opposite electrode, which is on the plurality of third intermediate layers, and corresponding to the plurality of first group areas and the plurality of second group areas.

According to some embodiments, the plurality of first group areas and the plurality of second group areas may be alternately arranged in a row direction.

According to some embodiments, the first pixel electrode may be provided with a plurality of first pixel electrodes, the second pixel electrode may be provided with a plurality of second pixel electrodes, the third pixel electrode may be provided with a plurality of third pixel electrodes, the plurality of first pixel electrodes, the plurality of second pixel electrodes, and the plurality of third pixel electrodes may be arranged on the substrate in a matrix form, each of the plurality of first group areas may include first pixel electrodes and second pixel electrodes arranged in a corresponding column among the plurality of first pixel electrodes and the plurality of second pixel electrodes, and each of the plurality of second group areas may include third pixel electrodes arranged in a corresponding column among the plurality of third pixel electrodes.

According to some embodiments, the plurality of first group areas and the plurality of second group areas may be arranged in a first direction, and the plurality of first group areas and the plurality of second group areas may be alternately arranged in a second direction crossing the first direction.

According to some embodiments, in a plan view, a first separation area between the plurality of first group areas and a second separation area between the plurality of second group areas may be adjacent to each other in the second direction.

According to some embodiments, in a plan view, a virtual line connecting a first separation area between the plurality of first group areas and a second separation area between the plurality of second group areas may extend in a third direction crossing the first direction and the second direction.

According to some embodiments, the display apparatus may further include a pixel defining layer on the plurality of third pixel electrodes and having a plurality of openings exposing at least a portion of each of the plurality of third pixel electrodes, wherein a distance between a first opening and a second opening adjacent to each other in the first direction among the plurality of openings may be less than a distance between a third opening and a fourth opening adjacent to each other in the first direction among the plurality of openings, the first opening and the second opening may be in a same second group area, and the third opening and the fourth opening may be in second group areas adjacent to each other in the first direction among the plurality of second group areas, respectively.

According to some embodiments, the first intermediate layer may be configured to emit light of a first wavelength band, the second intermediate layer may be configured to emit light of a second wavelength band, and the third intermediate layer may be configured to emit light of a third wavelength band.

According to some embodiments, portions of the second capping layer corresponding to the plurality of first group areas may be between the opposite electrode and the plurality of first capping layers, respectively.

According to some embodiments, the plurality of first group areas may be arranged in a first direction and a second direction crossing the first direction, a first separation area between a (1-1)th group area and a (1-2)th group area adjacent to each other in the first direction among the plurality of first group areas and a second separation area between a (1-3)th group area and a (1-4)th group area adjacent to each other in the first direction among the plurality of first group areas may be apart from each other in the second direction, the (1-1)th group area and the (1-3)th group area may be apart from each other in the second direction, and the (1-2)th group area and the (1-4)th group area may be apart from each other in the second direction.

According to some embodiments, the first direction may be perpendicular to the second direction.

According to some embodiments, the display apparatus may further include a pixel defining layer on the plurality of first pixel electrodes and the plurality of second pixel electrodes and having a plurality of openings exposing at least a portion of each of the plurality of first pixel electrodes and the plurality of second pixel electrodes, wherein the plurality of first group areas may be arranged in a first direction, a distance between a first opening and a second opening adjacent to each other in the first direction among the plurality of openings may be less than a distance between a third opening and a fourth opening adjacent to each other in the first direction among the plurality of openings, the first opening and the second opening may be in a same first group area, and the third opening and the fourth opening may be in first group areas adjacent to each other in the first direction among the plurality of first group areas, respectively.

According to some embodiments, the plurality of first capping layers may be arranged in a first direction and a second direction crossing the first direction, a first separation area between a (1-1)th capping layer and a (1-2)th capping layer adjacent to each other in the first direction among the plurality of first capping layers and a second separation area between a (1-3)th capping layer and a (1-4)th capping layer adjacent to each other in the first direction among the plurality of first capping layers may be apart from each other in the second direction, the (1-1)th capping layer and the (1-3)th capping layer may be apart from each other in the second direction, and the (1-2)th capping layer and the (1-4)th capping layer may be apart from each other in the second direction.

According to some embodiments, the first direction may be perpendicular to the second direction.

According to some embodiments, a method of manufacturing a display apparatus includes preparing a substrate in which a plurality of first group areas apart from each other are defined, forming a first pixel electrode and a second pixel electrode in each of the plurality of first group areas, forming a first intermediate layer on the first pixel electrode, forming a second intermediate layer on the second pixel electrode, forming an opposite electrode on the first intermediate layer and the second intermediate layer, and forming, on the opposite electrode, a plurality of first capping layers apart from each other to correspond to the plurality of first group areas.

According to some embodiments, the forming of the plurality of first capping layers may use a first mask having a plurality of openings, and the plurality of openings may correspond to the plurality of first group areas, respectively.

According to some embodiments, a plurality of second group areas apart from each other may be further defined in the substrate, and the method may further include forming a third pixel electrode in each of the plurality of second group areas, forming, on the third pixel electrode, a plurality of third intermediate layers apart from each other to correspond to the plurality of second group areas, and forming, on the opposite electrode, a second capping layer corresponding to the plurality of first group areas and the plurality of second group areas.

According to some embodiments, the forming of the plurality of third intermediate layers may use a second mask having a plurality of openings, and the plurality of openings may correspond to the plurality of second group areas, respectively.

According to some embodiments, the first intermediate layer may be configured to emit light of a first wavelength band, the second intermediate layer may be configured to emit light of a second wavelength band, and the third intermediate layer may be configured to emit light of a third wavelength band.

According to some embodiments, the first pixel electrode may be provided with a plurality of first pixel electrodes, the second pixel electrode may be provided with a plurality of second pixel electrodes, and the plurality of first pixel electrodes and the plurality of second pixel electrodes may be alternately arranged.

Other aspects, features, and characteristics of embodiments according to the present disclosure will become better understood through the accompanying drawings, the claims and the detailed description.

These general and specific aspects may be implemented by using a system, a method, a computer program, or any combinations thereof.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
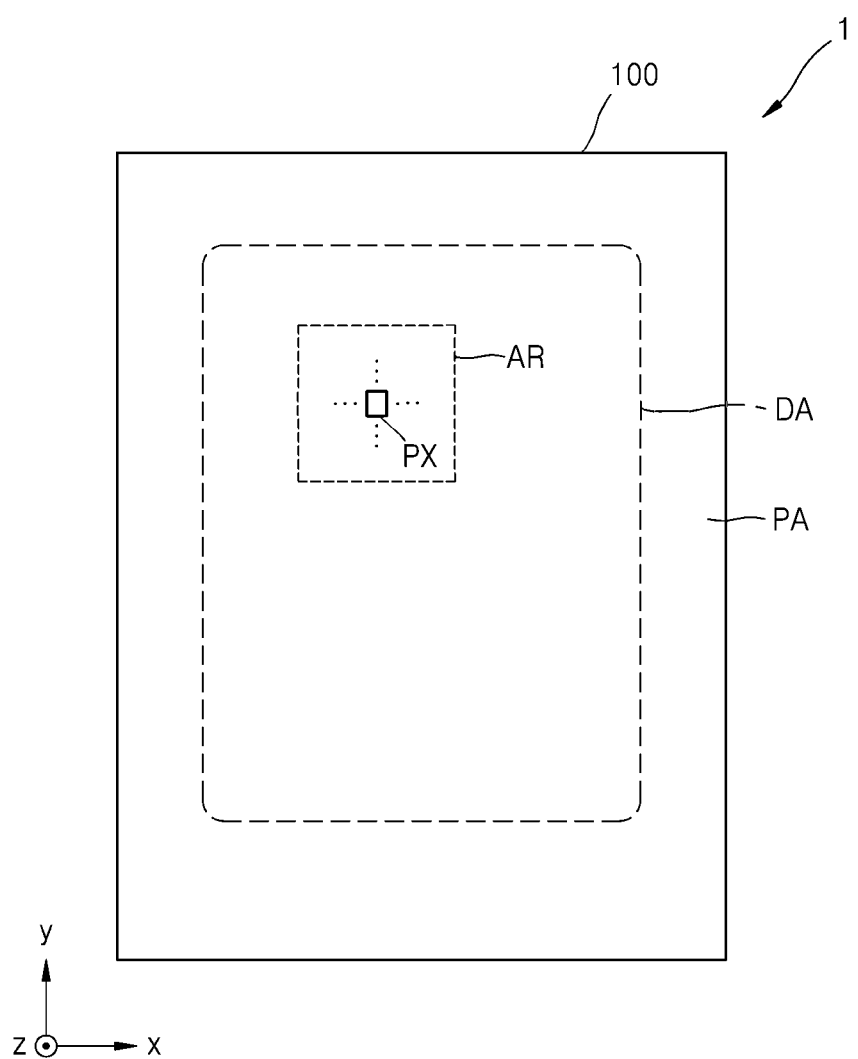
FIG. 1 is a schematic plan view of a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. The expression "at least one of A and B" indicates only A, only B, or both A and B.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic plan view of a display apparatus 1 according to some embodiments.

Referring to FIG. 1, the display apparatus 1 may include a display area DA in which images are displayed and a peripheral area PA around the display area DA. The display apparatus 1 may display images to the outside by using light emitted from the first area DA.

A substrate 100 may include various materials such as glass, metal, or plastic. According to some embodiments, the substrate 100 may include a flexible material. The flexible material refers to a bendable, foldable, or rollable substrate. The substrate 100 including such a flexible material may include ultra-thin glass, metal, or plastic.

Pixels PX including various display elements such as an organic light-emitting diode (OLED) may be in the display area DA of the substrate 100. A plurality of pixels PX may be arranged in various forms, such as a stripe arrangement, a pentile arrangement, or a mosaic arrangement, and may display images.

In a plan view, as illustrated in FIG. 1, the display area DA may have a rectangular shape. According to some embodiments, the display area DA may have a polygonal shape (e.g., a triangular shape, a pentagonal shape, or a hexagonal shape), a circular shape, an elliptical shape, or an irregular shape.

The peripheral area PA of the substrate 100 is around the display area DA (e.g., in a periphery of the display area DA, or outside a footprint of the display area DA), and may be an area in which no images are displayed. In the peripheral area PA, various lines configured to transmit electric signals to be applied to the display area DA, and pads bonded to a printed circuit board or a driver integrated circuit (IC) chip may be arranged.

Figure 2:
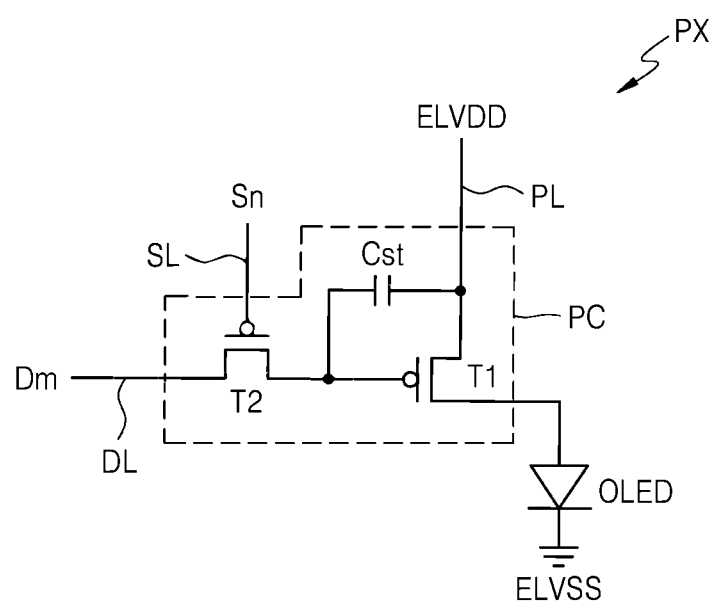
FIG. 2 is a schematic equivalent circuit diagram of a pixel of a display apparatus, according to some embodiments.

FIG. 2 is a schematic equivalent circuit diagram of a pixel PX of a display apparatus, according to some embodiments.

Referring to FIG. 2, the pixel PX may include a pixel circuit PC connected to a scan line SL and a data line DL, and an organic light-emitting diode OLED connected to the pixel circuit PC.

The pixel circuit PC may include a driving thin-film transistor T1, a scan thin-film transistor T2, and a storage capacitor Cst. The scan thin-film transistor T2 may be connected to the scan line SL and the data line DL and may be configured to transmit, to the driving thin-film transistor T1, a data signal Dm input through the data line DL in response to a scan signal Sn input through the scan line SL.

The storage capacitor Cst may be connected to the scan thin-film transistor T2 and a driving voltage line PL and may be configured to store a voltage corresponding to a difference between a voltage received from the scan thin-film transistor T2 and a driving voltage ELVDD supplied to the driving voltage line PL.

The driving thin-film transistor T1 may be connected to the driving voltage line PL and the storage capacitor Cst and may be configured to control a driving current flowing from the driving voltage line PL to the organic light-emitting diode OLED in response to a voltage value stored in the storage capacitor Cst. The organic light-emitting diode OLED may emit light having a certain luminance according to the driving current.

Although a case in which the pixel circuit PC includes two thin-film transistors and one storage capacitor has been described with reference to FIG. 2, embodiments according to the present disclosure are not limited thereto. For example, the pixel circuit PC may include three or more thin-film transistors and/or two or more storage capacitors. According to some embodiments, the pixel circuit PC may include seven thin-film transistors and one storage capacitor. Additionally, according to some embodiments, the pixel circuit PC may include additional components or fewer components than the number and configuration of components described above without departing from the spirit and scope of embodiments according to the present disclosure.

Figure 3:
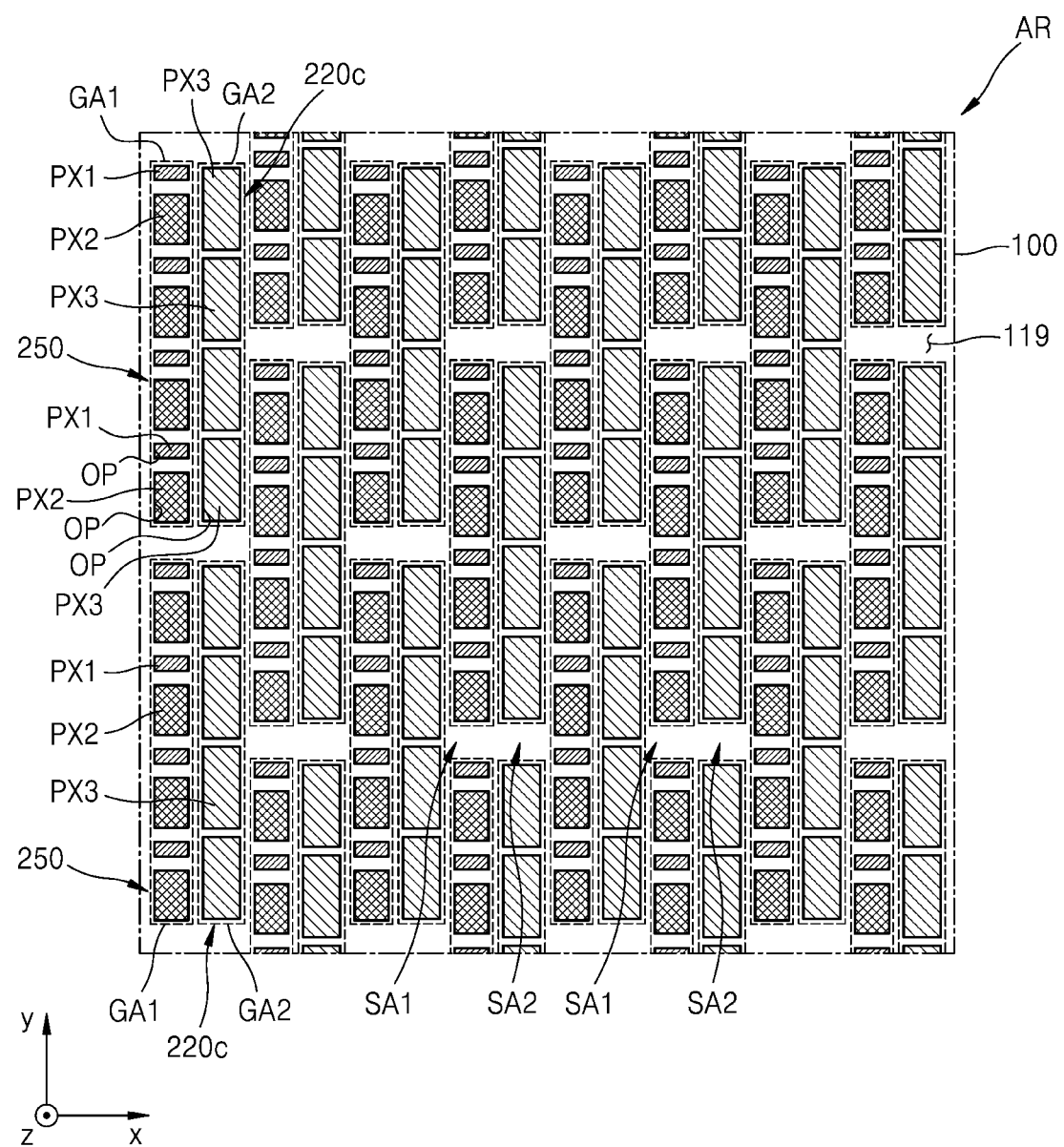
FIG. 3 is a schematic enlarged plan view of a portion of FIG. 1.
Figure 4:
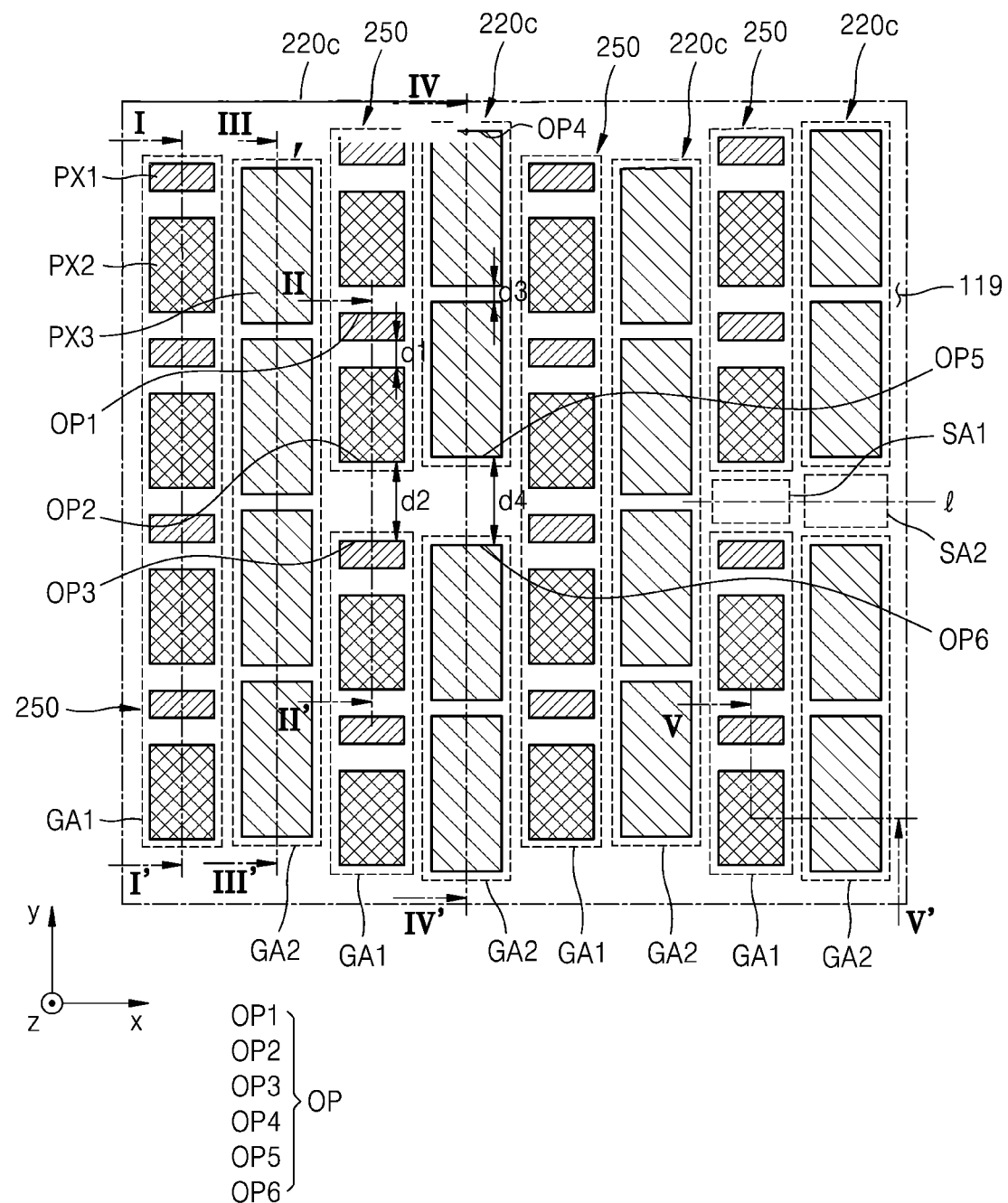
FIG. 4 is a schematic enlarged plan view of a portion of FIG. 3.

FIG. 3 is a schematic enlarged plan view of a portion of FIG. 1, and FIG. 4 is a schematic enlarged plan view of a portion of FIG. 3. For example, FIG. 3 is an enlarged plan view of the region AR of FIG. 1.

Referring to FIG. 3, the display apparatus (see 1 in FIG. 1) may include a plurality of first group areas GA1 and a plurality of second group areas GA2. Because the display apparatus 1 includes a substrate 100, it may be stated that the substrate 100 includes the first group areas GA1 and the second group areas GA2.

The first group areas GA1 and the second group areas GA2 may be spaced apart from each other along a row direction. The first group areas GA1 and the second group areas GA2 may extend in a first direction (e.g., ±y direction) and may be arranged relative to each other along a second direction (e.g., ±x direction) crossing the first direction.

The first group areas GA1 and the second group areas GA2 may be alternately arranged in the second direction (e.g., ±x direction). For example, as illustrated in FIG. 3, the second group areas GA2 may be between the first group areas GA1 that are spaced apart in the second direction (e.g., ±x direction). For example, the first group areas GA1 may be arranged in each odd-numbered column and the second group areas GA2 may be arranged in each even-numbered column, although embodiments are not limited thereto, and according to some embodiments, the first group areas GA1 may be arranged in even-numbered columns and the second group areas GA2 may be arranged in odd-numbered columns.

A plurality of first pixels PX1 and a plurality of second pixels PX2 may be in each of the first group areas GA1. A plurality of third pixels PX3 may be in each of the second group areas GA2. According to some embodiments, each of the first, second, and third pixels PX1, PX2, and PX3 may correspond to an emission area in which a display element emits light as a minimum unit for implementing images. That is, the first, second, and third pixels PX1, PX2, and PX3 may represent sub-pixels that collectively form a pixel. When an organic light-emitting diode is employed as the display element, the emission area may be defined by an opening OP of a pixel defining layer 119. As will be described in more detail later with reference to FIGS. 5 to 9, the opening OP of the pixel defining layer 119 may expose at least a portion of a first pixel electrode 210a constituting a first display element 200a. In a plan view, edges of the first pixel electrode 210a may surround the opening OP of the pixel defining layer 119. Therefore, it may be understood that a plurality of first pixel electrodes 210a are in the first group area GA1. Although the above description has been given focusing on the first pixels PX1, the same may also apply to the second pixels PX2 and the third pixels PX3.

According to some embodiments, as illustrated in FIG. 4, a distance d1 between a first opening OP1 and a second opening OP2 adjacent to each other in the first direction (e.g., ±y direction) among a plurality of openings OP may be less than a distance d2 between the second opening OP2 and a third opening OP3 adjacent to each other in the first direction (e.g., ±y direction) among the openings OP. In this case, the first opening OP1 and the second opening OP2 may be in the same first group area GA1, and the second opening OP2 and the third opening OP3 may be in the first group areas GA1 adjacent to each other in the first direction (e.g., ±y direction), respectively.

According to some embodiments, as illustrated in FIG. 4, a distance d3 between a fourth opening OP4 and a fifth opening OP5 adjacent to each other in the first direction (e.g., ±y direction) among the openings OP may be less than a distance d4 between the fifth opening OP5 and a sixth opening OP6 adjacent to each other in the first direction (e.g., ±y direction) among the openings OP. In this case, the fourth opening OP4 and the fifth opening OP5 may be in the same second group area GA2, and the fifth opening OP5 and the sixth opening OP6 may be in the second group areas GA2 adjacent to each other in the first direction (e.g., ±y direction), respectively.

A plurality of first pixels PX1, a plurality of second pixels PX2, and a plurality of third pixels PX3 may be alternately arranged in the second direction (e.g., ±x direction). For example, as illustrated in FIG. 3, the third pixels PX3 may be between the first pixels PX1 and the second pixels PX2 apart from each other in the second direction (e.g., ±x direction). The first pixels PX1 and the second pixels PX2 may be in each odd-numbered column, and the third pixels PX3 may be in each even-numbered column.

According to some embodiments, as illustrated in FIG. 3, the first pixels PX1 and the second pixels PX2 may be alternately arranged in the first direction (e.g., ±y direction). For example, the first pixels PX1 may be arranged in each odd-numbered column and the second pixels PX2 may be arranged in each even-numbered column.

The first pixels PX1 may emit light of a first wavelength band, the second pixels PX2 may emit light of a second wavelength band, and the third pixels PX3 may emit light of a third wavelength band.

According to some embodiments, the first pixels PX1 may emit red light, the second pixels PX2 may emit green light, and the third pixels PX3 may emit blue light. In this case, the first wavelength band may be about 630 nm to about 750 nm, the second wavelength band may be about 490 nm to about 570 nm, and the third wavelength band may be about 450 nm to about 490 nm. This is only an example, and the wavelength band of the light emitted from each of the first pixels PX1, the second pixels PX2, and the third pixels PX3 may be changed.

Although FIGS. 3 and 4 illustrate that four first pixels PX1 and four second pixels PX2 are in each of the first group areas GA1, this is only an example. The number of first pixels PX1 and the number of second pixels PX2 in each of the first group areas GA1 may be variously changed. For example, five or more first pixels PX1 and five or more second pixels PX2 may be in each of the first group areas GA1. As another example, one or two first pixels PX1 and one or two second pixels PX2 may be in each of the first group areas GA1. This will be described in more detail later with reference to FIGS. 13 to 16.

Also, although FIGS. 3 and 4 illustrate that four third pixels PX3 are in each of the second group areas GA2, this is only an example. The number of third pixels PX3 in each of the second group areas GA2 may be variously changed. For example, five or more third pixels PX3 may be in each of the second group areas GA2. As another example, one or two third pixels PX3 may be in each of the second group areas GA2. This will be described in more detail later with reference to FIGS. 11 and 12.

The display apparatus 1 may include first separation areas SA1 between the first group areas GA1 and second separation areas SA2 between the second group areas GA2. The first separation areas SA1 may be between the first group areas GA1 adjacent to each other in the first direction (e.g., ±y direction), and the second separation areas SA2 may be between the second group areas GA2 adjacent to each other in the first direction (e.g., ±y direction). Because the display apparatus 1 includes the substrate 100, it may be stated that the substrate 100 includes the first separation areas SA1 and the second separation areas SA2.

According to some embodiments, as illustrated in FIG. 4, the first separation area SA1 and the second separation area SA2 may be adjacent to each other in the second direction (e.g., ±x direction) in a plan view. A virtual line l connecting the first separation area SA1 to the second separation area SA2 may be parallel to the second direction (e.g., ±x direction).

Although FIGS. 3 and 4 illustrate the first separation area SA1 and the second separation area SA2 are adjacent to each other in the second direction (e.g., ±x direction), this is only an example, and the first separation area SA1 and the second separation area SA2 may be variously arranged. For example, in a plan view, the first separation area SA1 may be shifted in the first direction (e.g., ±y direction) at the second separation area SA2. This will be described in more detail later with reference to FIG. 10.

The display apparatus 1 may include a plurality of first capping layers 250 spaced apart from each other to correspond to the first group areas GA1, respectively. The first capping layers 250 will be described in more detail with reference to FIG. 5.

Figure 18A:
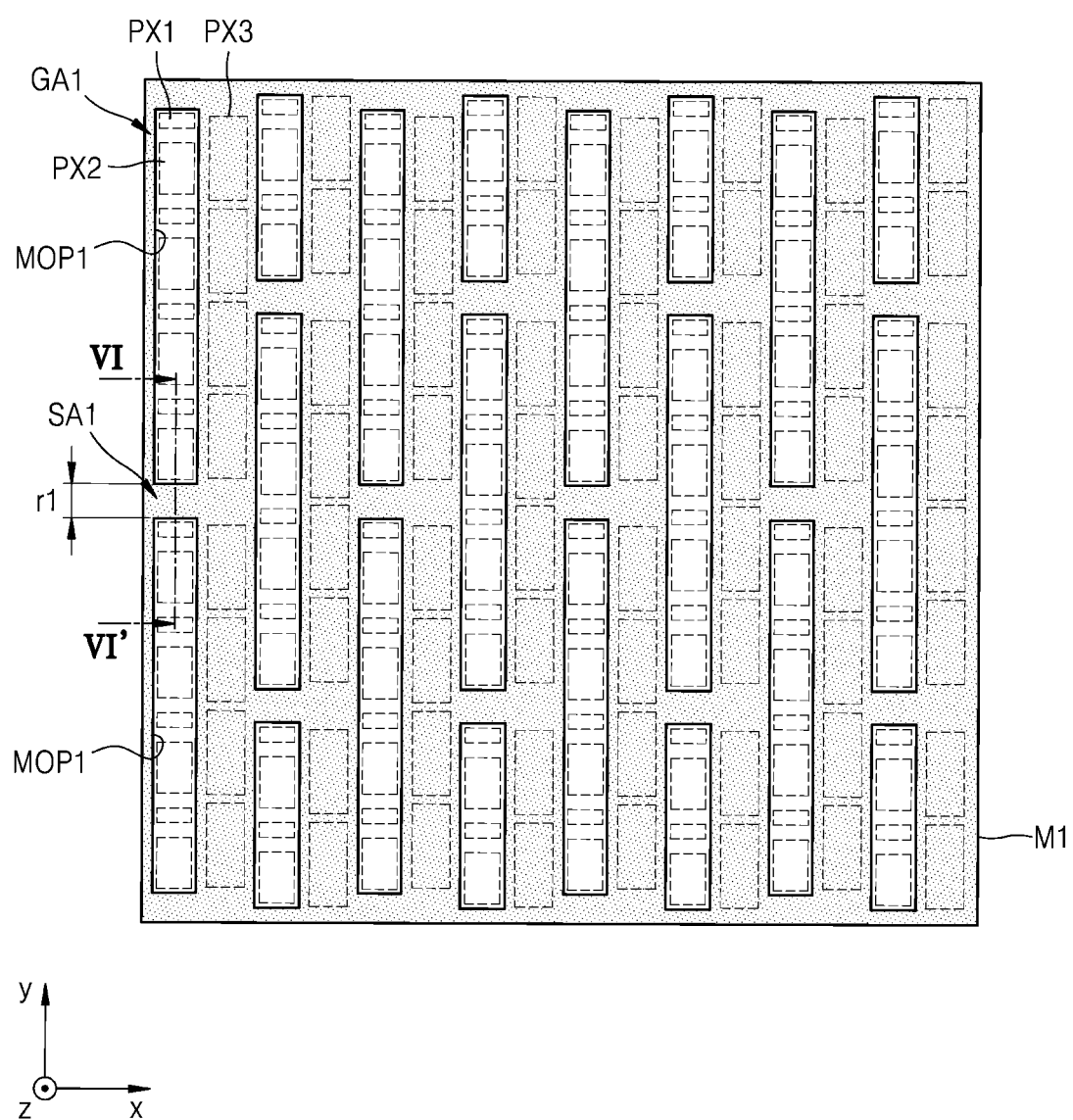
FIG. 18A is a schematic plan view illustrating an example of a mask for forming a first capping layer.
Figure 18B:
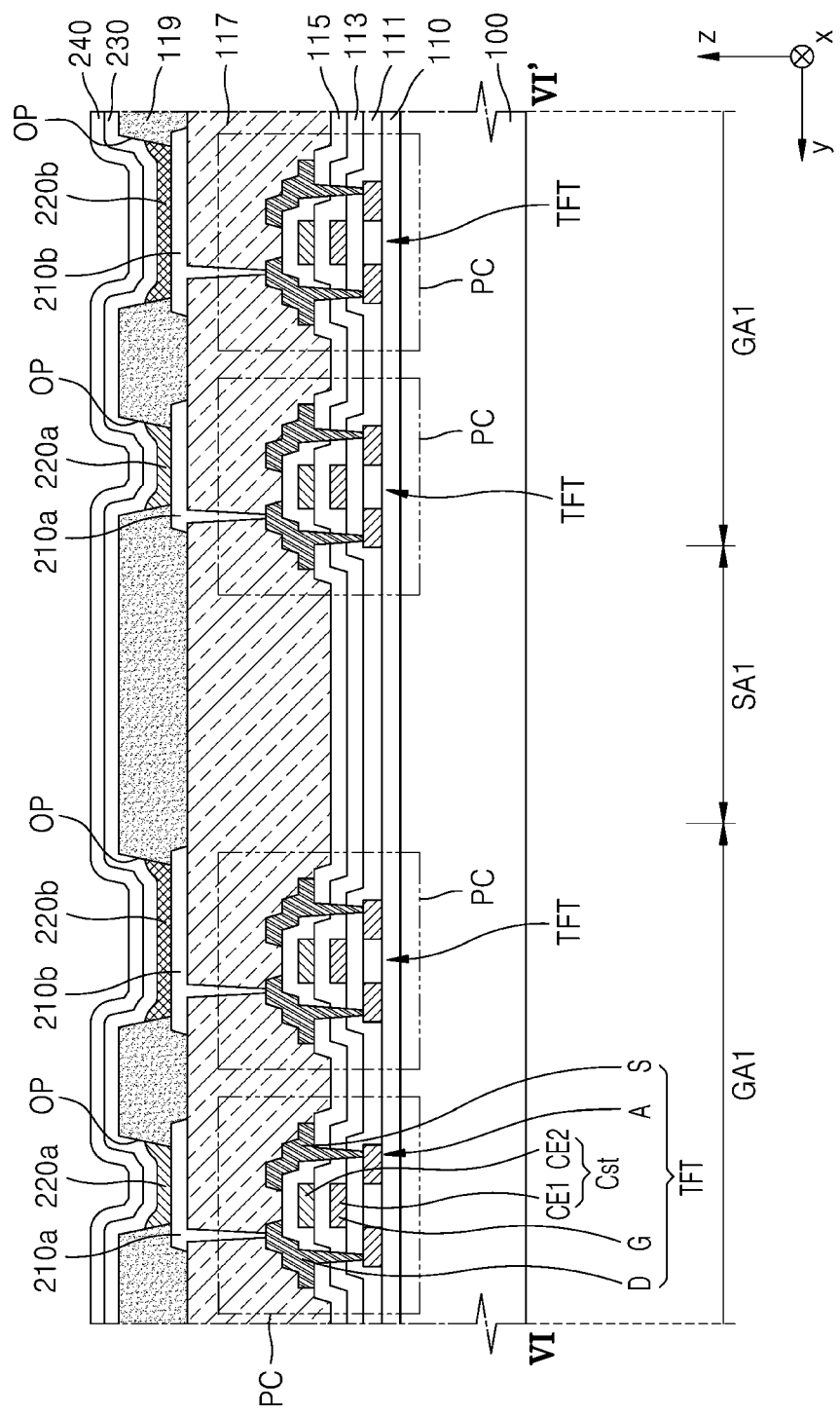
FIGS. 18B to 18D are cross-sectional views sequentially illustrating a method of manufacturing a display apparatus, according to some embodiments.
Figure 18C:
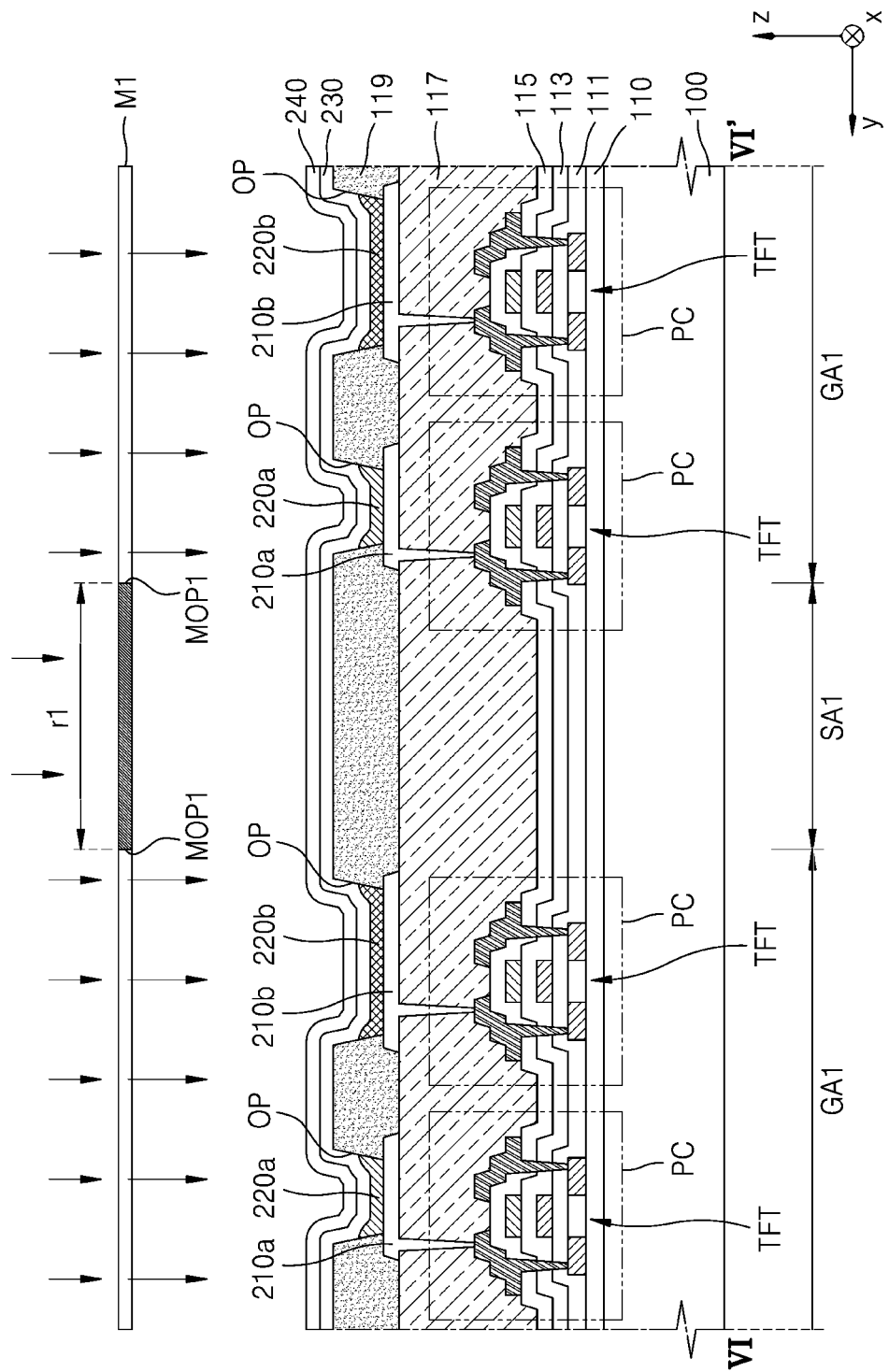

As illustrated in FIGS. 18A and 18C to be described later, because the first capping layers 250 are formed using a first mask M1 having a plurality of openings MOP1 corresponding to a plurality of first group areas GA1, respectively, the first capping layers 250 may correspond to the first group areas GA1, respectively. The planar shape of each of the first capping layers 250 may substantially correspond to the planar shape of each of the first group areas GA1.

As such, the first capping layers 250 may correspond to the first group areas GA1 in which the first pixels PX1 and the second pixels PX2 emitting light of different wavelength bands from each other are arranged. The first capping layers 250 overlapping the first pixels PX1 and the second pixels PX2 emitting light of different wavelength bands from each other may be formed using a single mask.

As a comparative example, the capping layers overlapping the pixels emitting light of the same color may be formed using the same mask, and the capping layers overlapping the pixels emitting light of different colors from each other may be formed using different masks from each other. In this case, the number of masks used to form the capping layers overlapping the pixels emitting light of different colors from each other may be equal to the number of different colors from each other. For example, two masks may be used to form the capping layers overlapping the pixels emitting red light and green light.

However, according to some embodiments, when one mask is used to form the first capping layers 250a overlapping the first pixels PX1 and the second pixels PX2, even though the first pixels PX1 and the second pixels PX2 emit light of different wavelength bands from each other, one mask is used, and thus, the manufacturing process may be relatively simplified and the manufacturing cost may be reduced.

Also, the display apparatus 1 may include a plurality of third intermediate layers 220c apart from each other to correspond to the second group areas GA2, respectively. The third intermediate layers 220c will be described in more detail with reference to FIG. 7.

Figure 19A:
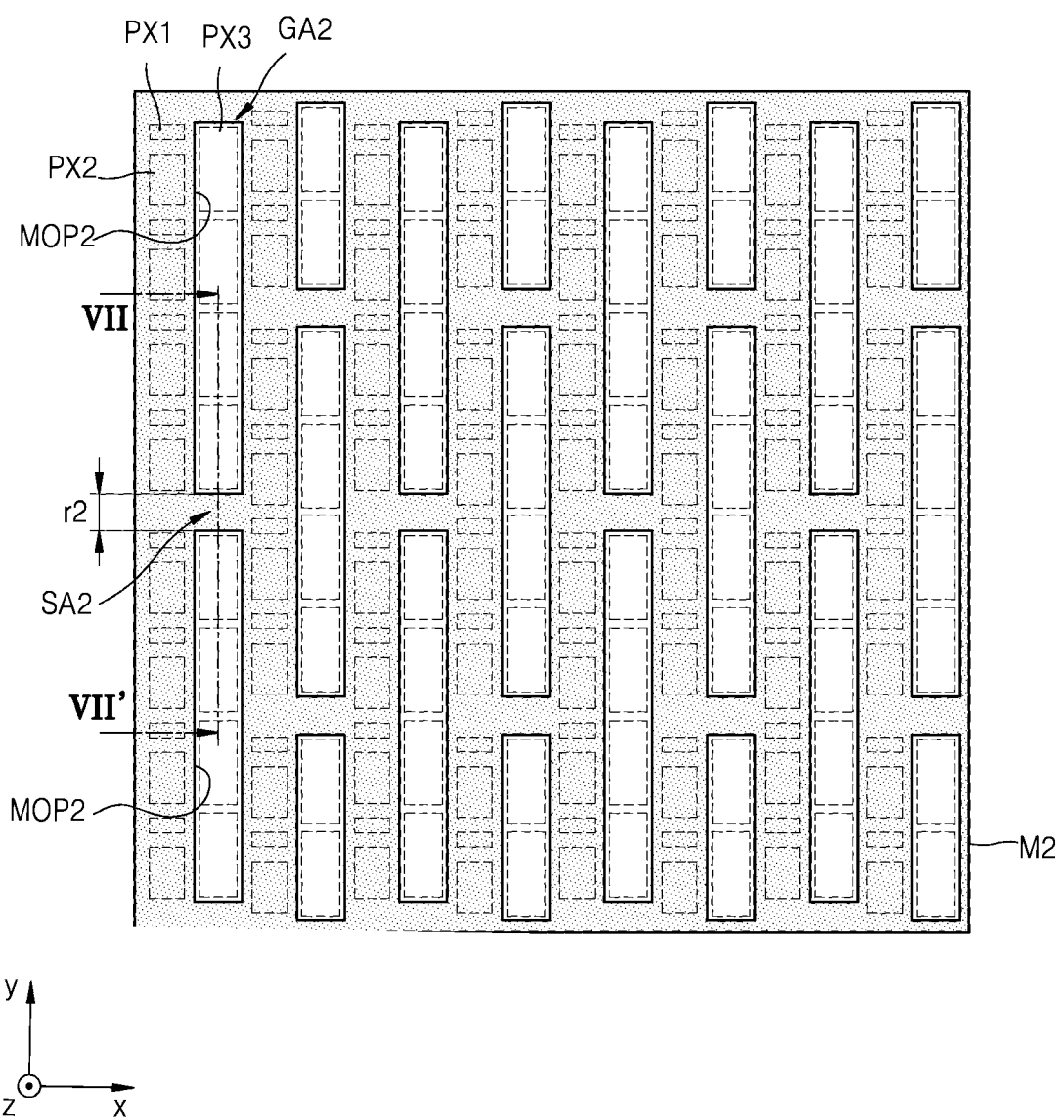
FIG. 19A is a schematic plan view illustrating an example of a mask for forming a third intermediate layer.
Figure 19B:
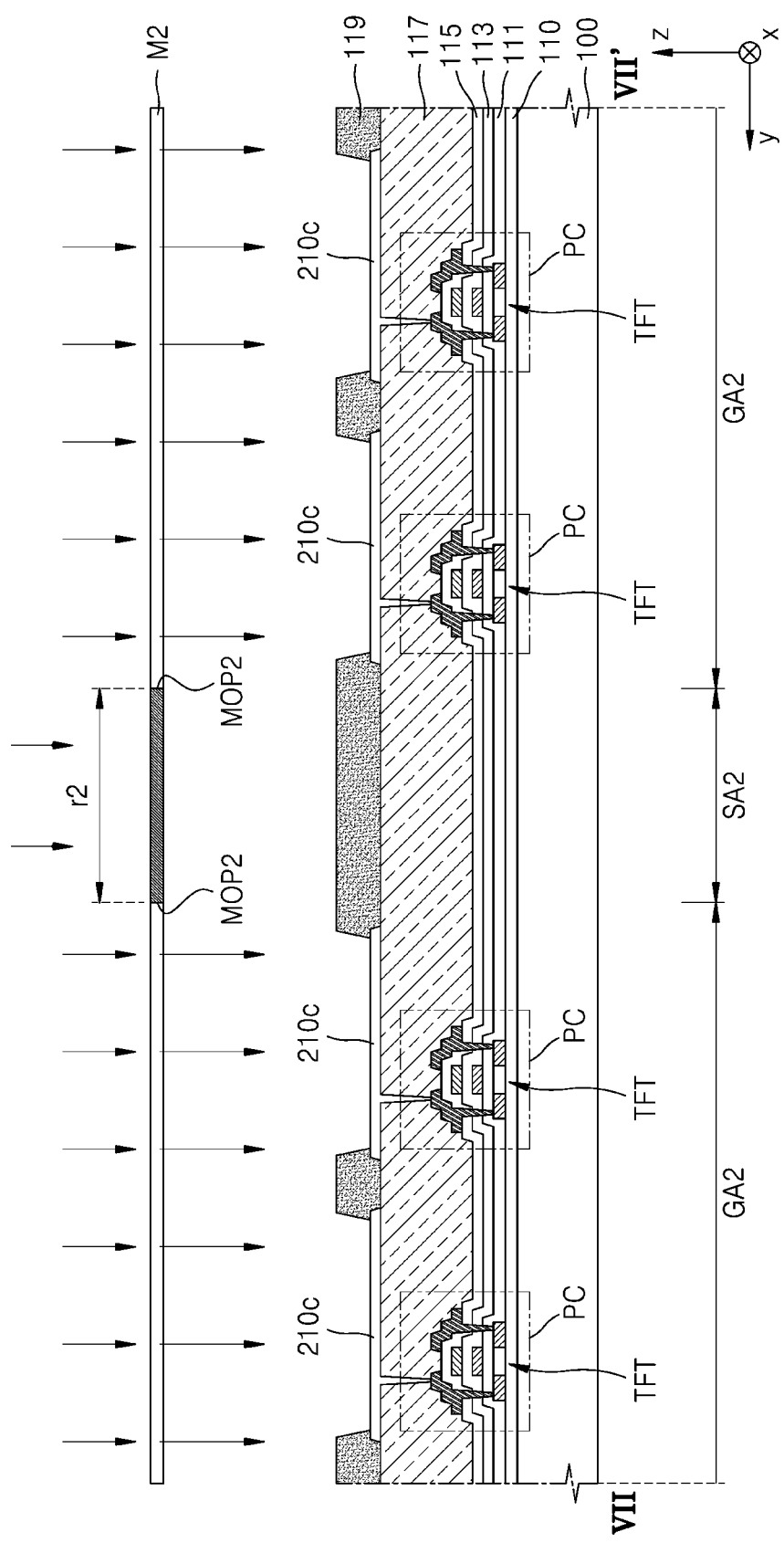
FIGS. 19B and 19C are cross-sectional views sequentially illustrating a method of manufacturing a display apparatus, according to some embodiments.

As illustrated in FIGS. 19A and 19B to be described in more detail later, because the third intermediate layers 220c are formed using a second mask M2 having a plurality of openings MOP2 corresponding to a plurality of second group areas GA2, respectively, the third intermediate layers 220c may correspond to the second group areas GA2, respectively. The planar shape of each of the third intermediate layers 220c may substantially correspond to the planar shape of each of the second group areas GA2.

When the third intermediate layers 220c corresponding to the third pixels PX3 are integrally formed as in the embodiment, the second separation area SA2 between the second group areas GA2 per unit area may be reduced. When the second separation area SA2 per unit area is reduced, the space in which the third pixels PX3 may be arranged is relatively wide. Therefore, the size of each of the third pixels PX3 may increase.

Figure 5:
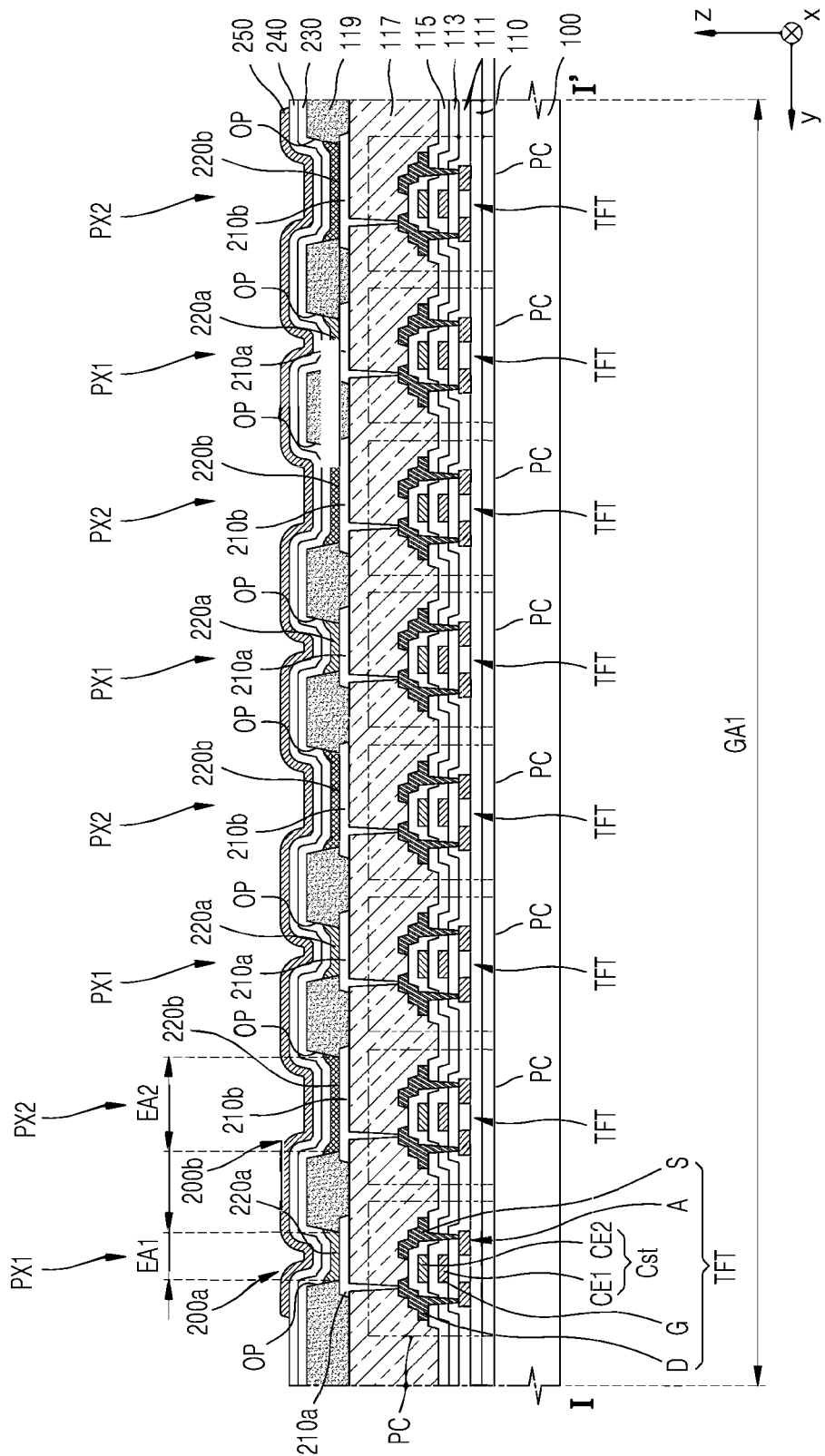
FIG. 5 is a cross-sectional view of a first group area taken along the line I-I' of FIG. 4.

FIG. 5 is a cross-sectional view of the first group area GA1 taken along line I-I' of FIG. 4. For example, FIG. 5 is a cross-sectional view illustrating one of the first group areas GA1 of FIG. 4. In FIG. 5, the same reference numerals as those in FIGS. 3 and 4 denote the same members, and redundant descriptions thereof are omitted.

Referring to FIG. 5, the substrate 100 may include the first group area GA1. A plurality of first pixels PX1 and a plurality of second pixels PX2 may be in the first group area GA1.

The first pixels PX1 may correspond to a plurality of first emission areas EA1 in which a plurality of first display elements 200a emit light as a minimum unit implementing an image. When an organic light-emitting diode is employed as the first display element 200a, the first emission area EA1 may be defined by an opening OP of a pixel defining layer 119.

The opening OP of the pixel defining layer 119 may expose at least a portion of a first pixel electrode 210a constituting the first display element 200a. In a plan view, edges of the first pixel electrode 210a may surround the opening OP of the pixel defining layer 119. Therefore, it may be understood that a plurality of first pixel electrodes 210a are in the first group area GA1. Although the above description has been given focusing on the first pixels PX1, the same may also apply to a plurality of second pixels PX2.

The second pixels PX2 may correspond to a plurality of second emission areas EA2 in which a plurality of second display elements 200b emit light as a minimum unit implementing an image. When an organic light-emitting diode is employed as the second display element 200b, the second emission area EA2 may be defined by an opening OP of the pixel defining layer 119.

The opening OP of the pixel defining layer 119 may expose at least a portion of a second pixel electrode 210b constituting the second display element 200b. In a plan view, edges of the second pixel electrode 210b may surround the opening OP of the pixel defining layer 119. Therefore, it may be understood that a plurality of second pixel electrodes 210b are in the first group area GA1.

According to some embodiments, as illustrated in FIG. 5, the area of the first emission area EA1 may be less than the area of the second emission area EA2.

Although FIG. 5 illustrates that the area of the first emission area EA1 is less than the area of the second emission area EA2, the area of the first emission area EA1 may be equal to the area of the second emission area EA2, or the area of the first emission area EA1 may be greater than the area of the second emission area EA2.

Hereinafter, the display apparatus 1 according to some embodiments will be described in detail according to the stacking order illustrated in FIG. 5.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure that includes an inorganic layer and a layer including the above-described polymer resin.

A buffer layer 110 may reduce or prevent infiltration of foreign material, moisture, or ambient air from below the substrate 100 and may provide a flat surface on the substrate 100. The buffer layer 110 may include an inorganic material such as an oxide or a nitride, an organic material, or an organic/inorganic composite material, and may have a single-layer or multilayer structure including an inorganic material and an organic material.

The display apparatus 1 may further include a barrier layer between the substrate 100 and the buffer layer 110. The barrier layer may prevent or minimize infiltration of impurities from the substrate 100 or the like into a semiconductor layer A. The barrier layer may include an inorganic material such as an oxide or a nitride, an organic material, or an organic/inorganic composite material, and may have a single-layer structure or a multilayer structure including an inorganic material and an organic material.

The semiconductor layer A may be on the buffer layer 110. The semiconductor layer A may include amorphous silicon or polysilicon. According to some embodiments, the semiconductor layer A may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel region, and a source region and a drain region on both sides of the channel region. The semiconductor layer A may include a single layer or multiple layers.

A first gate insulating layer 111 and a second gate insulating layer 113 may be stacked on the substrate 100 to cover the semiconductor layer A. The first gate insulating layer 111 and the second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A gate electrode G may be on the first gate insulating layer 111 to overlap at least a portion of the semiconductor layer A. FIG. 5 illustrates that the gate electrode G is on the first gate insulating layer 111, but according to some embodiments, the gate electrode G may be on the second gate insulating layer 113.

According to some embodiments, the storage capacitor Cst may include a lower electrode CE1 and an upper electrode CE2. As illustrated in FIG. 5, the storage capacitor Cst may overlap the thin-film transistor TFT. For example, the gate electrode G of the thin-film transistor TFT may function as the lower electrode CE1 of the storage capacitor Cst. Unlike this, the storage capacitor Cst may not overlap the thin-film transistor TFT and may be separately present.

The upper electrode CE2 of the storage capacitor Cst overlaps the lower electrode CE1 with the second gate insulating layer 113 therebetween to form a capacitor. In this case, the second gate insulating layer 113 may function as a dielectric layer of the storage capacitor Cst.

An interlayer insulating layer 115 may be on the second gate insulating layer 113 to cover the upper electrode CE2 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A source electrode S, a drain electrode D, and the like may be on the interlayer insulating layer 115.

The source electrode S and the drain electrode D may include a conductive material including molybdenum (Mo), aluminum (Al), copper (Cu), titanium (Ti), and the like, and may include a single layer or multiple layers including the above-described material. For example, the source electrode S and the drain electrode D may have a multilayer structure of Ti/Al/Ti. The source electrode S and the drain electrode D may be connected to the source region or the drain region of the semiconductor layer A through contact holes.

The source electrode S and the drain electrode D may be covered with an inorganic protective layer. The inorganic protective layer may be a single layer or multiple layers including silicon nitride ($SiN_x$) and silicon oxide ($SiO_x$). The inorganic protective layer may cover and protect some lines on the interlayer insulating layer 115.

A planarization layer 117 may be arranged to cover the source electrode S and the drain electrode D, and the planarization layer 117 may include contact holes for connecting the thin-film transistors TFT to the first pixel electrodes 210a and the second pixel electrodes 210b.

The planarization layer 117 may include a single layer or multiple layers including an organic material and may provide a flat upper surface. The planarization layer 117 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, or any blend thereof.

The first and second display elements 200a and 200b may be on the planarization layer 117. The first display element 200a includes a first pixel electrode 210a, a first intermediate layer 220a including an organic emission layer, and an opposite electrode 230, and the second display element 200b includes a second pixel electrode 210b, a second intermediate layer 220b including an organic emission layer, and an opposite electrode 230.

The first and second pixel electrodes 210a and 210b may include a (semi)transmissive electrode or a reflective electrode. According to some embodiments, the first and second pixel electrodes 210a and 210b may include a reflective layer including Ag, Mg, Al, Pt, Pd, Au, Ni, Nd, Ir, Cr, or a compound thereof, and a transparent or translucent electrode layer on the reflective layer. The transparent or translucent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the first and second pixel electrodes 210a and 210b may include ITO/Ag/ITO.

According to some embodiments, as illustrated in FIG. 5, the first pixel electrodes 210a and the second pixel electrodes 210b may be alternately arranged. The first pixel electrodes 210a and the second pixel electrodes 210b may be alternately arranged in the first direction (e.g., ±y direction).

In the display area (see DA in FIG. 1) of the substrate 100, a pixel defining layer 119 may be on the planarization layer 117. Also, the pixel defining layer 119 may prevent an electric arc or the like from occurring on edges of the first and second pixel electrodes 210a and 210b by increasing distances between the edges of the first and second pixel electrodes 210a and 210b and portions of the opposite electrode 230 on the first and second pixel electrodes 210a and 210b. The pixel defining layer 119 may include a plurality of openings OP exposing at least a portion of each of the first and second pixel electrodes 210a and 210b.

The pixel defining layer 119 may include at least one organic insulating material selected from polyimide, polyamide, acrylic resin, benzocyclobutene, and phenol resin, and may be formed by spin coating or the like.

The first and second intermediate layers 220a and 220b may be arranged in the openings OP defined by the pixel defining layer 119, and may include an organic emission layer. The organic emission layer may include an organic material including a fluorescent material or a phosphorescent material that emits red light, green light, blue light, or white light. The organic emission layer may include a low molecular weight organic material or a high molecular weight organic material. A functional layer such as a hole transport layer (HTL), a hole injection layer (HIL), an electron transport layer (ETL), an electron injection layer (EIL), and the like may be optionally further arranged below and above the organic emission layer.

The first intermediate layer 220a may emit light of a first wavelength band and the second intermediate layer 220b may emit light of a second wavelength band.

According to some embodiments, the first intermediate layer 220a may emit red light and the second intermediate layer 220b may emit green light. In this case, the first wavelength band may be about 630 nm to about 750 nm, and the second wavelength band may be about 490 nm to about 570 nm. This is only an example, and the wavelength bands of light emitted from the first and second intermediate layers 220a and 220b may be changed.

The opposite electrode 230 may include a transmissive electrode or a reflective electrode. According to some embodiments, the opposite electrode 230 may include a transparent or translucent electrode, and may include a metal thin-film having a low work function, including Li, Ca, LiF/Ca, LiF/Al, Al, Ag, Mg, or any compound thereof. Also, a transparent conductive oxide (TCO) layer such as ITO, IZO, ZnO, or $In_2O_3$ may be further on the metal thin-film. The opposite electrode 230 may be over the display area DA, and may be on the first and second intermediate layers 220a and 220b and the pixel defining layer 119. The opposite electrode 230 may be formed integrally with the first and third display elements 200a and 200b to correspond to the first and second pixel electrodes 210a and 210b.

A first capping layer 250 and a second capping layer 240 may be on the opposite electrode 230. As illustrated in FIG. 5, the second capping layer 240 may be on the opposite electrode 230, and the first capping layer 250 may be on the second capping layer 240. As another example, the first capping layer 250 may be on the opposite electrode 230, and the second capping layer 240 may be on the first capping layer 250.

The first capping layer 250 and the second capping layer 240 may include an organic material, an inorganic material, or any mixture thereof. Examples of the organic material may include at least one selected from tris-8-hydroxyquinoline aluminum (Alq3), ZnSe, 2,5-bis(6'-(2',2"-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4,4'-diamine (TPD), 1,1'-bis(di-4-tolylaminophenyl) cyclohexane (TAPC), triaryl amine derivative (EL301), 8-quinolinolato lithium (Liq), N(diphenyl-) 4-yl)9,9-dimethyl-N-(4(9-phenyl-9H-carbazol-3-yl)phenyl)-9H-fluorene-2-amine(HT211), and 2-(4-(9,10-di(naphthalene-2-yl)anthracene-2-yl)phenyl)-1-phenyl-1H-benzo-[D]imidazole (LG201). Examples of the inorganic material may include at least one selected from ITO, IZO, $SiO_2$, $SiN_x$, $Y_2O_3$, $WO_3$, $MoO_3$, and $Al_2O_3$.

The first capping layer 250 and the second capping layer 240 may be formed by various methods such as vacuum deposition, spin coating, casting, or a Langmuir-Blodgett (LB) method.

The first capping layer 250 and the second capping layer 240 may protect the opposite electrode 230 and increase light extraction efficiency. For example, the first capping layer 250 and the second capping layer 240 may include a material having a refractive index of about 1.2 to about 3.1.

The thicknesses of the first capping layer 250 and the second capping layer 240 may be adjusted to cause resonance between the upper surfaces of the first capping layer 250 and the reflective layers of the first and second pixel electrodes 210a and 210b. Optical resonance may occur between the upper surfaces of the first capping layer and the reflective layer of each of the first and second pixel electrodes 210a and 210b. Therefore, light extraction efficiency may increase, viewing angle characteristics may improve, and external luminescence efficiency may increase.

The thicknesses of the first capping layer 250 and the second capping layer 240 may be adjusted according to the presence or absence of the first capping layer 250. For example, the total thickness of the capping layer when the first capping layer 250 is on the second capping layer 240 may be greater than the total thickness of the capping layer when the first capping layer 250 is not on the second capping layer 240.

Figure 7:
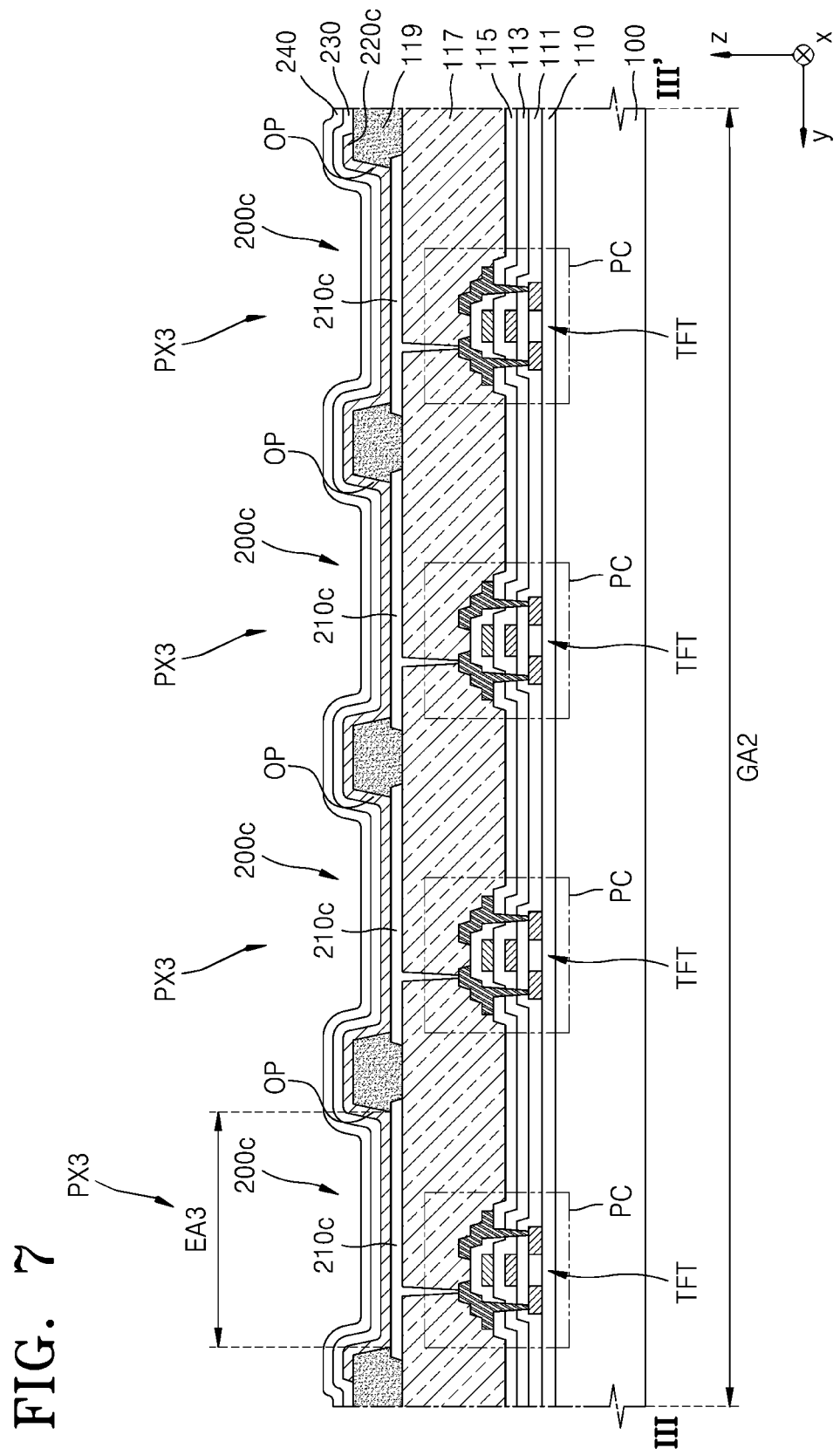
FIG. 7 is a cross-sectional view of a second group area taken along the line III-III' of FIG. 4.

The thicknesses of the first capping layer 250 and the second capping layer 240 may be different from each other according to the wavelength band of light emitted from the first and second display elements 200a and 200b. For example, as illustrated in FIG. 5, when the first and second display elements 200a and 200b emit red light and green light, respectively, the total thickness of the capping layer may be increased because the first capping layer 250 is on the second capping layer 240. As illustrated in FIG. 7 to be described in more detail later, when the third display element 200c emits blue light, the first capping layer 250 may be omitted and the total thickness of the capping layer may be reduced.

According to some embodiments, as illustrated in FIG. 5, the first capping layer 250 may be over the first group area GA1 and may correspond to the first and second display elements 200a and 200b in the first group area GA1. The first capping layer 250 may be over the first group area GA1 and may correspond to the first and second display elements 200a and 200b in the first group area GA1. The first capping layer 250 may be over the first group area GA1 and may correspond to the first and second pixel electrodes 210a and 210b in the first group area GA1. The first capping layer 250 may be over the first group area GA1 and may overlap the first and second pixel electrodes 210a and 210b in the first group area GA1.

Referring to FIGS. 3 and 4 described above, the first capping layers 250 may be apart from each other to correspond to the first group areas GA1, respectively. The first capping layers 250 may correspond to the first and second display elements 200a and 200b in each of the first group areas GA1, respectively. The first capping layers 250 may correspond to the first and second pixel electrodes 210a and 210b in each of the first group areas GA1, respectively.

According to some embodiments, as illustrated in FIG. 5, the second capping layer 240 may be over the display area DA like the opposite electrode 230. The second capping layer 240 may be on the opposite electrode 230 in correspondence with the opposite electrode 230.

When the first and second display elements 200a and 200b are organic light-emitting diodes, the organic light-emitting diodes may be easily damaged by external moisture or oxygen. Therefore, an encapsulation layer may cover and protect the organic light-emitting diodes. The encapsulation layer may cover the display area DA and extend to at least a portion of the peripheral area PA. The encapsulation layer may include a first inorganic encapsulation layer, an organic encapsulation layer, and a second inorganic encapsulation layer.

Figure 6:
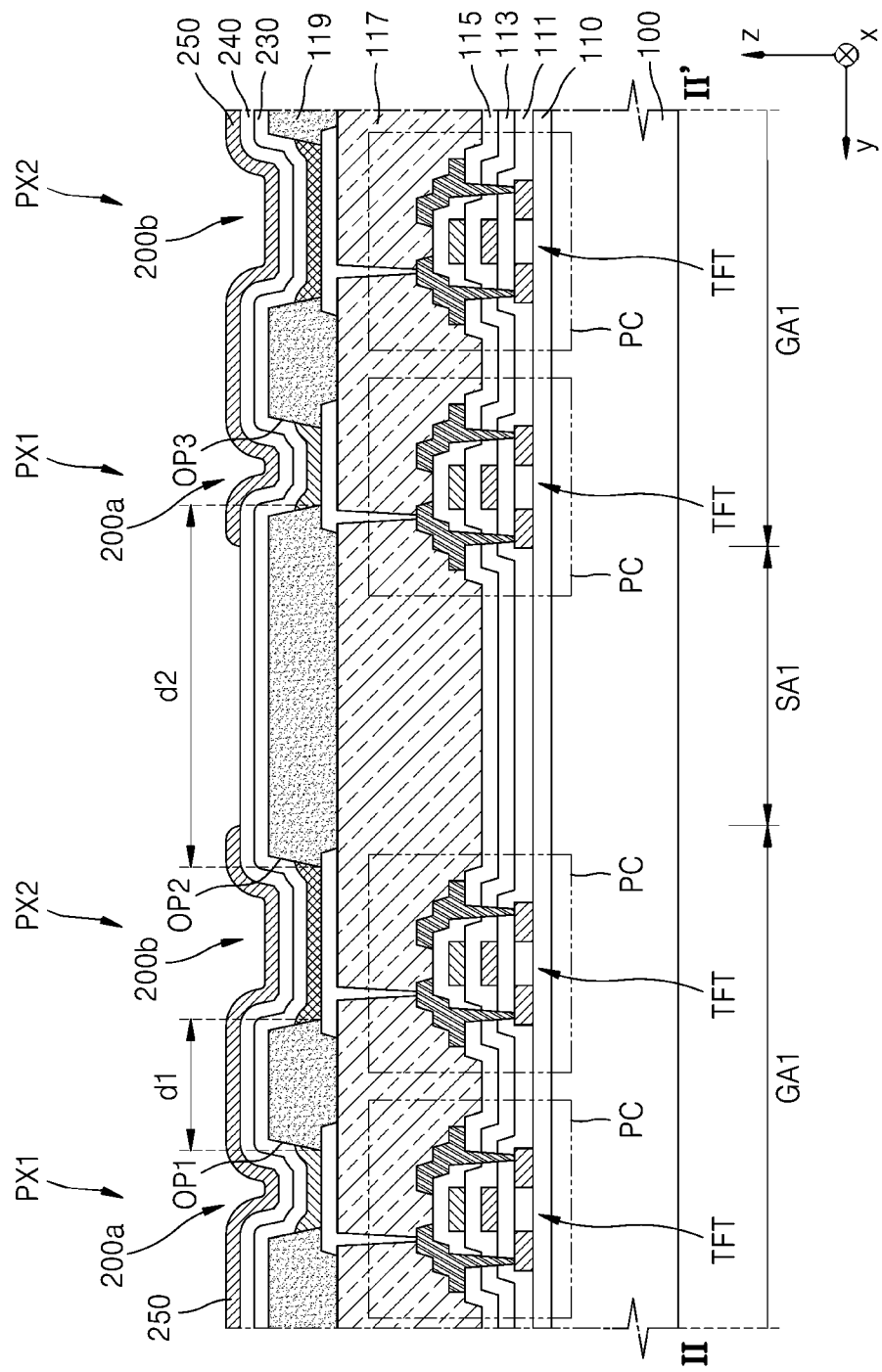
FIG. 6 is a cross-sectional view of the first group area and a first separation area taken along the line II-II' of FIG. 4.

FIG. 6 is a cross-sectional view of the first group area GA1 and the first separation area SA1 taken along line II-II' of FIG. 4. For example, FIG. 6 is a cross-sectional view of the first group areas GA1 adjacent to each other in the first direction in FIG. 4. In FIG. 6, the same reference numerals as those in FIGS. 3 to 5 denote the same members, and redundant descriptions thereof are omitted.

Referring to FIG. 6, the substrate 100 may include the first group areas GA1 and the first separation area SA1 between the first group areas GA1. The first separation area SA1 may be between the first group areas GA1 in the first direction (e.g., ±y direction).

According to some embodiments, the first capping layers 250 may be apart from each other to correspond to the first group areas GA1, respectively. The first capping layers 250 may correspond to the first and second display elements 200a and 200b in each of the first group areas GA1, respectively. The first capping layers 250 may correspond to the first and second pixel electrodes 210a and 210b in each of the first group areas GA1, respectively.

According to some embodiments, because the edges of the first capping layers 250 may correspond to the first group areas GA1, respectively, the area between the first capping layers 250 corresponding to different first group areas GA1 from each other may correspond to the first separation area SA1. The area may be between the first capping layers 250 adjacent to each other in the first direction (e.g., ±y direction).

As illustrated in FIGS. 18A and 18C to be described in more detail later, because the first capping layers 250 are formed using a first mask M1 having a plurality of openings MOP1 corresponding to a plurality of first group areas GA1, respectively, the edges of the first capping layers 250 may correspond to the first group areas GA1, respectively. The planar shape of each of the first capping layers 250 may substantially correspond to the planar shape of each of the first group areas GA1.

Also, the area between the openings MOP1 (corresponding to a first rib r1 in FIG. 18A) may correspond to the first separation area SA1. The area may be between the openings MOP1 in the first direction (e.g., ±y direction).

According to some embodiments, as illustrated in FIG. 6, a distance d1 between a first opening OP1 and a second opening OP2 adjacent to each other in the first direction (e.g., ±y direction) among a plurality of openings OP may be less than a distance d2 between the second opening OP2 and a third opening OP3 adjacent to each other in the first direction (e.g., ±y direction) among the openings OP. In this case, the first opening OP1 and the second opening OP2 may be in the same first group area GA1, and the second opening OP2 and the third opening OP3 may be in the first group areas GA1 adjacent to each other in the first direction (e.g., ±y direction), respectively.

FIG. 7 is a cross-sectional view of the second group area GA2 taken along line III-III' of FIG. 4. For example, FIG. 7 is a cross-sectional view illustrating one of the second group areas GA2 of FIG. 4. In FIG. 7, the same reference numerals as those in FIGS. 3 to 5 denote the same members, and some redundant descriptions thereof may be omitted.

Referring to FIG. 7, the substrate 100 may include the second group area GA2. A plurality of third pixels PX3 may be in the second group area GA2.

The third pixels PX3 may correspond to a plurality of third emission areas EA3 in which a plurality of third display elements 200c emit light as a minimum unit implementing an image, respectively. When an organic light-emitting diode is employed as the third display element 200c, the third emission area EA3 may be defined by an opening OP of the pixel defining layer 119.

The opening OP of the pixel defining layer 119 may expose at least a portion of a third pixel electrode 210c constituting the third display element 200c. In a plan view, edges of the third pixel electrode 210c may surround the opening OP of the pixel defining layer 119. Therefore, it may be understood that a plurality of third pixel electrodes 210c are in the second group area GA2.

As illustrated in FIG. 7, the third display element 200c is on a planarization layer 117. The third display element 200c includes the third pixel electrode 210c, a third intermediate layer 220c including an organic emission layer, and an opposite electrode 230.

The third pixel electrode 210c may include a (semi) transmissive electrode or a reflective electrode. According to some embodiments, the third pixel electrode 210c may include a reflective layer including Ag, Mg, Al, Pt, Pd, Au, Ni, Nd, Ir, Cr, or a compound thereof, and a transparent or translucent electrode layer on the reflective layer. The transparent or translucent electrode layer may include at least one selected from indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the third pixel electrode 210c may include ITO/Ag/ITO.

In the display area (see DA in FIG. 1) of the substrate 100, a pixel defining layer 119 may be on the planarization layer 117. Also, the pixel defining layer 119 may prevent an electric arc or the like from occurring on edges of the third pixel electrodes 210c by increasing distances between the edges of the third pixel electrodes 210c and portions of an opposite electrode 230 on the third pixel electrodes 210c. The pixel defining layer 119 may include a plurality of openings OP exposing at least a portion of the third pixel electrode 210c.

The third intermediate layer 220c may be arranged in the openings OP defined by the pixel defining layer 119, and may include an organic emission layer. The organic emission layer may include an organic material including a fluorescent material or a phosphorescent material that emits red light, green light, blue light, or white light. The organic emission layer may include a low molecular weight organic material or a high molecular weight organic material. A functional layer such as a hole transport layer (HTL), a hole injection layer (HIL), an electron transport layer (ETL), an electron injection layer (EIL), and the like may be optionally further arranged below and above the organic emission layer.

The third intermediate layer 220c may emit light of a third wavelength band. According to some embodiments, the third intermediate layer 220c may emit blue light. In this case, the third wavelength band may be about 450 nm to about 490 nm. This is only an example, and the wavelength band of light emitted from the third intermediate layer 220c may be changed.

According to some embodiments, as illustrated in FIG. 7, the third intermediate layer 220c may be arranged over the second group area GA2 and may correspond to a plurality of third pixel electrodes 210c in the second group area GA2. The third intermediate layer 220c may be over the second group area GA2 and may overlap the third pixel electrodes 210c in the second group area GA2. The third intermediate layers 220c may be over the second group area GA2 and may be integral (e.g., integrally formed) with each other on the third pixel electrodes 210c in the second group area GA2.

Referring to FIGS. 3 and 4 described above, the third intermediate layers 220c may be apart from each other to correspond to the second group areas GA2, respectively. The third intermediate layers 220c may correspond to the third pixel electrodes 210c in each of the second group areas GA2, respectively. The third intermediate layers 220c may be integral with each other on the third pixel electrodes 210c in each of the second group areas GA2, respectively.

The opposite electrode 230 may be on the second capping layer 240. The second capping layer 240 may be formed by various methods such as vacuum deposition, spin coating, casting, or an LB method.

The second capping layer 240 may protect the opposite electrode 230 and increase light extraction efficiency. For example, the second capping layer 240 may include a material having a refractive index of about 1.2 to about 3.1.

As described above with reference to FIG. 5, the thicknesses of the first capping layer 250 and the second capping layer 240 may be adjusted according to the presence or absence of the first capping layer 250. For example, the total thickness of the capping layer when the first capping layer 250 is on the second capping layer 240 may be greater than the total thickness of the capping layer when the first capping layer 250 is not on the second capping layer 240.

The thicknesses of the first capping layer 250 and the second capping layer 240 may be different from each other according to the wavelength band of light emitted from the first and second display elements 200a and 200b. For example, as illustrated in FIG. 5 described above, when the first and second display elements 200a and 200b emit red light and green light, respectively, the total thickness of the capping layer may be increased because the first capping layer 250 is on the second capping layer 240. As illustrated in FIG. 7, when the third display element 200c emits blue light, the first capping layer 250 may be omitted and the total thickness of the capping layer may be reduced. That is, the first capping layer 250 may not be in the second group area GA2.

Figure 8:
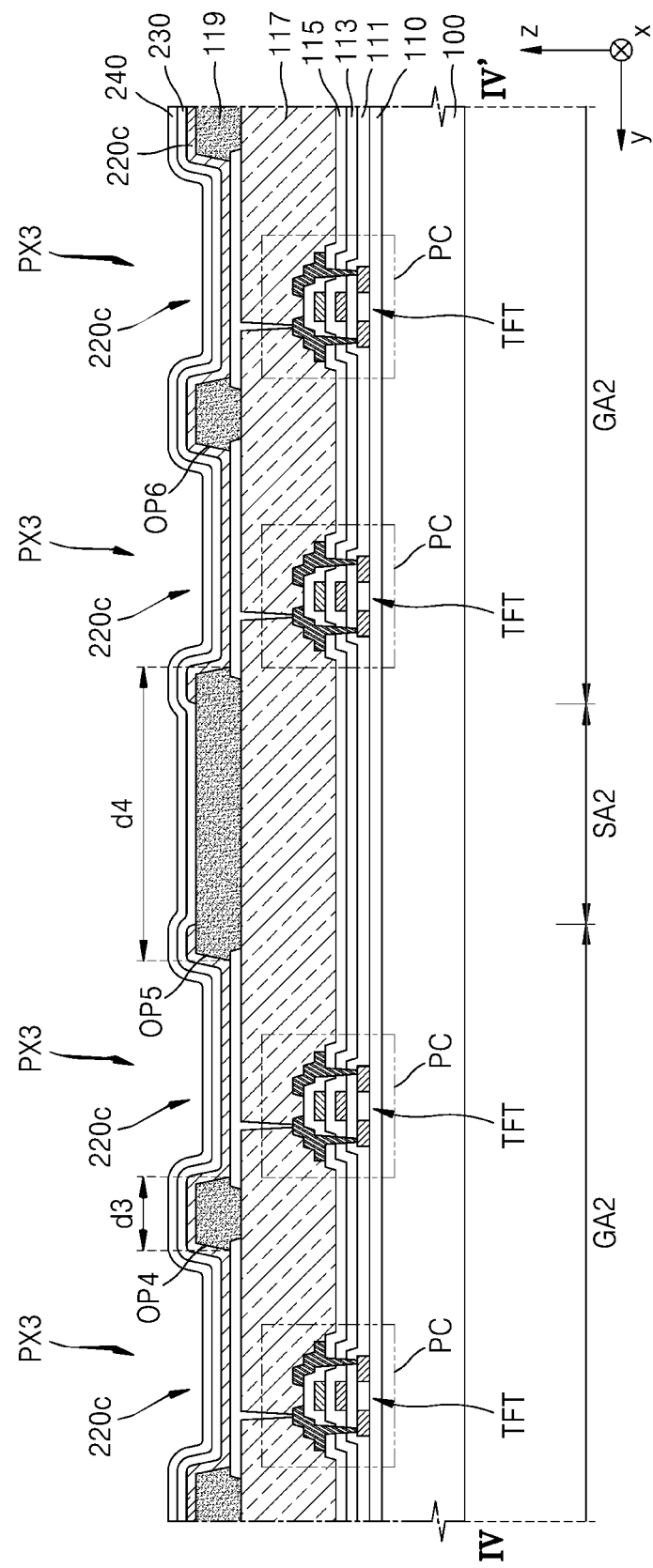
FIG. 8 is a cross-sectional view of the second group area and a second separation area taken along the line IV-IV' of FIG. 4.

FIG. 8 is a cross-sectional view of the second group area GA2 and the second separation area SA2 taken along the line IV-IV' of FIG. 4. For example, FIG. 8 is a cross-sectional view of the second group areas GA2 adjacent to each other in the first direction in FIG. 4. In FIG. 8, the same reference numerals as those in FIGS. 3 to 5 denote the same members, and redundant descriptions thereof are omitted.

Referring to FIG. 8, the substrate 100 may include the second group areas GA2 and the second separation area SA2 between the second group areas GA2. The second separation area SA2 may be between the second group areas GA2 in the first direction (e.g., ±y direction).

According to some embodiments, the third intermediate layers 220c may be apart from each other to correspond to the second group areas GA2, respectively. The third intermediate layers 220c may correspond to the third pixel electrodes 210c in each of the second group areas GA2, respectively. The third intermediate layers 220c may be integral with each other on the third pixel electrodes 210c in each of the second group areas GA2, respectively.

According to some embodiments, because the edges of the third intermediate layers 220c may correspond to the second group areas GA2, respectively, the area between the third intermediate layers 220c corresponding to different second group areas GA2 from each other may correspond to the second separation area SA2. The area may be between the third intermediate layers 220c adjacent to each other in the first direction (e.g., ±y direction).

As illustrated in FIGS. 19A and 19B to be described in more detail later, because the third intermediate layers 220c are formed using a second mask M2 having a plurality of openings MOP2 corresponding to a plurality of second group areas GA2, respectively, the third intermediate layers 220c may correspond to the second group areas GA2, respectively. The planar shape of each of the third intermediate layers 220c may substantially correspond to the planar shape of each of the second group areas GA2.

Also, the area between the openings MOP2 (corresponding to a second rib r2 in FIG. 19A) may correspond to the second separation area SA2. The area may be between the openings MOP2 in the first direction (e.g., ±y direction).

According to some embodiments, as illustrated in FIG. 8, a distance d3 between a fourth opening OP4 and a fifth opening OP5 adjacent to each other in the first direction (e.g., ±y direction) among the openings OP may be less than a distance d4 between the fifth opening OP5 and a sixth opening OP6 adjacent to each other in the first direction (e.g., ±y direction) among the openings OP. In this case, the fourth opening OP4 and the fifth opening OP5 may be in the same second group area GA2, and the fifth opening OP5 and the sixth opening OP6 may be in the second group areas GA2 adjacent to each other in the first direction (e.g., ±y direction), respectively.

Figure 9:
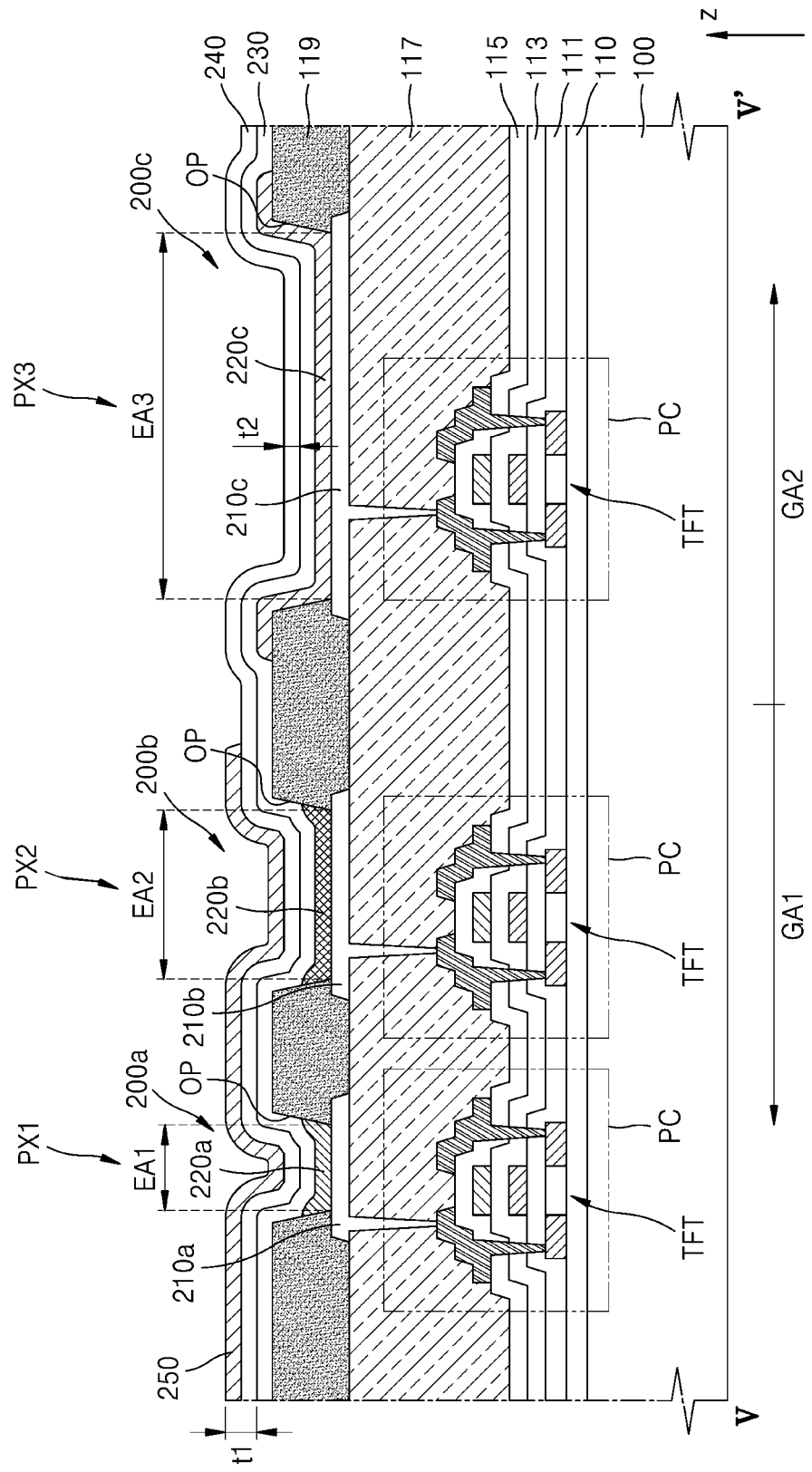
FIG. 9 is a cross-sectional view of a portion of the first group area and a portion of the second group area taken along the line V-V' of FIG. 4.

FIG. 9 is a cross-sectional view of a portion of the first group area GA1 and a portion of the second group area GA2 taken along line V-V of FIG. 4. For example, FIG. 9 is a cross-sectional view of the first to third pixels PX1 to PX3 of FIG. 4. In FIG. 9, the same reference numerals as those in FIGS. 3 to 5 denote the same members, and some redundant descriptions thereof may be omitted.

Referring to FIG. 9, the substrate may include the first group area GA1 and the second group area GA2. The first pixel PX1 and the second pixel PX2 may be in the first group area GA1, and the third pixel PX3 may be in the second group area GA2.

The first pixel PX1 may correspond to the first emission area EA1 in which the first display element 200a emits light. When the first display element 200a is an organic light-emitting diode, the first emission area EA1 may be defined by an opening OP of a pixel defining layer 119 exposing at least a portion of the first pixel electrode 210a of the first display element 200a.

The second pixel PX2 may correspond to the second emission area EA2 in which the second display element 200b emits light. When the second display element 200b is an organic light-emitting diode, the second emission area EA2 may be defined by an opening OP of the pixel defining layer 119 exposing at least a portion of the second pixel electrode 210b of the second display element 200b.

The third pixel PX3 may correspond to the third emission area EA3 in which the third display element 200c emits light. When the third display element 200c is an organic light-emitting diode, the third emission area EA3 may be defined by an opening OP of the pixel defining layer 119 exposing at least a portion of the third pixel electrode 210c of the third display element 200c.

The first pixel PX1 may emit light of a first wavelength band, the second pixel PX2 may emit light of a second wavelength band, and the third pixel PX3 may emit light of a third wavelength band.

According to some embodiments, the first pixel PX1 may emit red light, the second pixel PX2 may emit green light, and the third pixel PX3 may emit blue light. In this case, the first wavelength band may be about 630 nm to about 750 nm, the second wavelength band may be about 490 nm to about 570 nm, and the third wavelength band may be about 450 nm to about 490 nm. This is only an example, and the wavelength bands of light emitted from the first to third pixels PX1, PX2, and PX3 may be changed.

According to some embodiments, as illustrated in FIG. 9, the area of the third emission area EA3 may be greater than the area of the first emission area EA1 and the area of the second emission area EA2. Also, the area of the second emission area EA2 may be greater than the area of the first emission area EA1. This is only an example, and the area of each of the first to third emission areas EA1, EA2, and EA3 may be variously modified. For example, the area of the second emission area EA2 among the first to third emission areas EA1, EA2, and EA3 may be the greatest.

According to some embodiments, as illustrated in FIG. 9, the second capping layer 240 may be on the opposite electrode 230, and the first capping layer 250 may be on the second capping layer 240 corresponding to the first group area GA1. That is, the first capping layer 250 may not be on the second capping layer 240 corresponding to the second group area GA2. The first capping layer 250 may be on the first and second pixel electrodes 210a and 210b in the first group area GA1, and may overlap the first and second pixel electrodes 210a and 210b. The first capping layer 250 may not be on the third pixel electrode 210c in the second group area GA2, and may not overlap the third pixel electrode 210c.

As such, the total thickness of the capping layer may be adjusted through the presence or absence of the first capping layer 250. The total thickness of the capping layer may be different from each other according to the wavelength band of light emitted from the first to third intermediate layers 220a, 220b, and 220c. For example, the total thickness t1 of the capping layer may be increased by arranging the first capping layer 250 and the second capping layer 240 on the first and second intermediate layers 220a and 220b emitting red light and/or green light. Alternatively, only the second capping layer 240 may be on the third intermediate layer 220c emitting blue light, and the first capping layer 250 may be omitted. In this case, the total thickness t2 of the capping layer on the third intermediate layer 220c may be less than the total thickness t1 of the capping layer on the first and second intermediate layers 220a and 220b emitting red light and/or green light.

The total thickness of the capping layer may be adjusted through the presence or absence of the first capping layer 250 so that light emitted from the first to third intermediate layers 220a, 220b, and 220c causes optical resonance. The total thickness of the capping layer may be adjusted so that the optical resonance of the light emitted from the first to third intermediate layers 220a, 220b, and 220c is alleviated or optimized.

Figure 10:
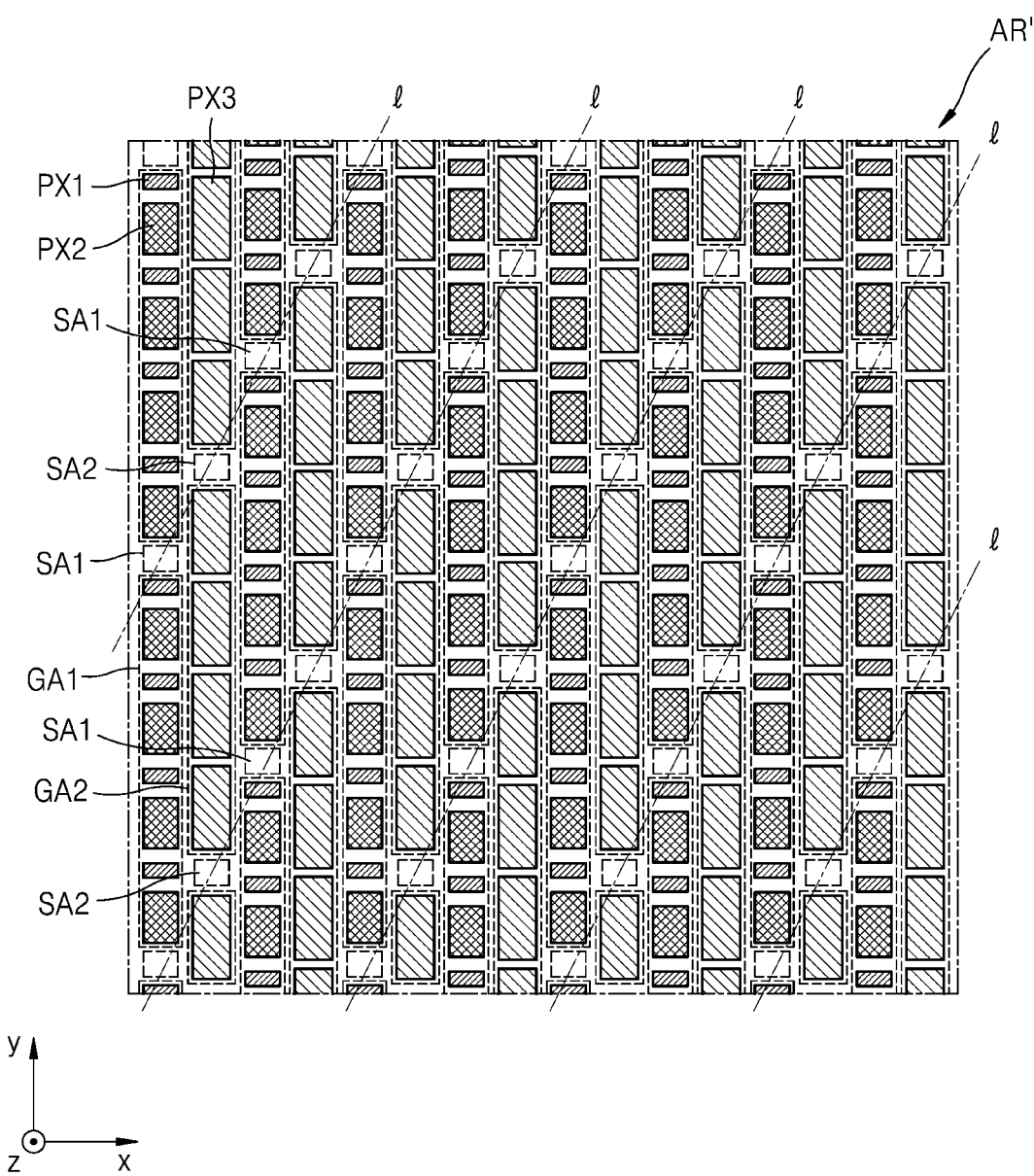
FIG. 10 is a schematic enlarged plan view of a display apparatus according to some embodiments.

FIG. 10 is a schematic enlarged plan view of a display apparatus according to some embodiments. Because the embodiments illustrated with respect to FIG. 10 share characteristics of the embodiments illustrated with respect to FIG. 3, the differences will be mainly described below, and some repetitive description of the same or similar elements may be omitted.

Referring to FIG. 10, the display apparatus (see 1 in FIG. 1) may include a plurality of first group areas GA1 and a plurality of second group areas GA2.

The first group areas GA1 and the second group areas GA2 may be apart from each other. The first group areas GA1 and the second group areas GA2 may be arranged in a first direction (e.g., ±y direction) and a second direction (e.g., ±x direction) crossing the first direction.

The first group areas GA1 and the second group areas GA2 may be alternately arranged in the second direction (e.g., ±x direction). For example, as illustrated in FIG. 10, the second group areas GA2 may be between the first group areas GA1 arranged in the second direction (e.g., ±x direction). The first group areas GA1 may be arranged in each odd-numbered column and the second group areas GA2 may be arranged in each even-numbered column.

A plurality of first pixels PX1 and a plurality of second pixels PX2 may be in each of the first group areas GA1. A plurality of third pixels PX3 may be in each of the second group areas GA2. The first pixels PX1 and the second pixels PX2 may be alternately arranged in the first direction (e.g., ±y direction).

The display apparatus 1 may include first separation areas SA1 between the first group areas GA1 and second separation areas SA2 between the second group areas GA2. The first separation areas SA1 may be between the first group areas GA1 adjacent to each other in the first direction (e.g., ±y direction), and the second separation areas SA2 may be between the second group areas GA2 adjacent to each other in the first direction (e.g., ±y direction).

According to some embodiments, in a plan view, the first separation area SA1 may be shifted in the first direction (e.g., ±y direction) at the second separation area SA2. Virtual lines l connecting the first separation area SA1 to the second separation area SA2 may be parallel to a third direction crossing the first direction (e.g., ±y direction) and the second direction (e.g., ±x direction). The virtual lines l connecting the first separation area SA1 to the second separation area SA2 may extend in the third direction crossing the first direction (e.g., ±y direction) and the second direction (e.g., ±x direction).

For example, as illustrated in FIG. 10, the virtual lines l connecting the first separation area SA1 to the second separation area SA2 may be parallel to the diagonal direction. The virtual lines l connecting the first separation area SA1 to the second separation area SA2 may extend in the diagonal direction.

Figure 11:
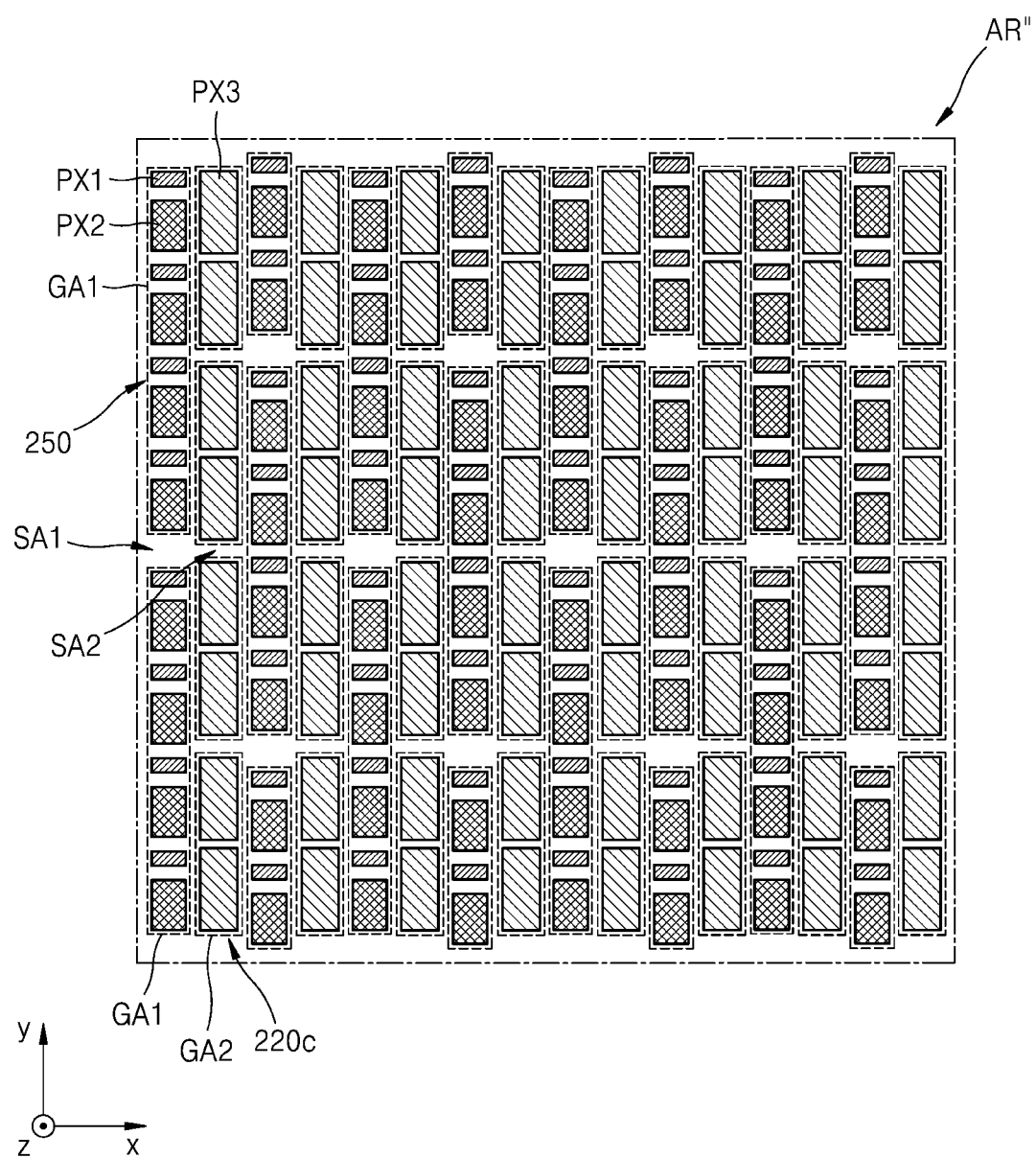
FIG. 11 is a schematic enlarged plan view of a display apparatus according to some embodiments.
Figure 12:
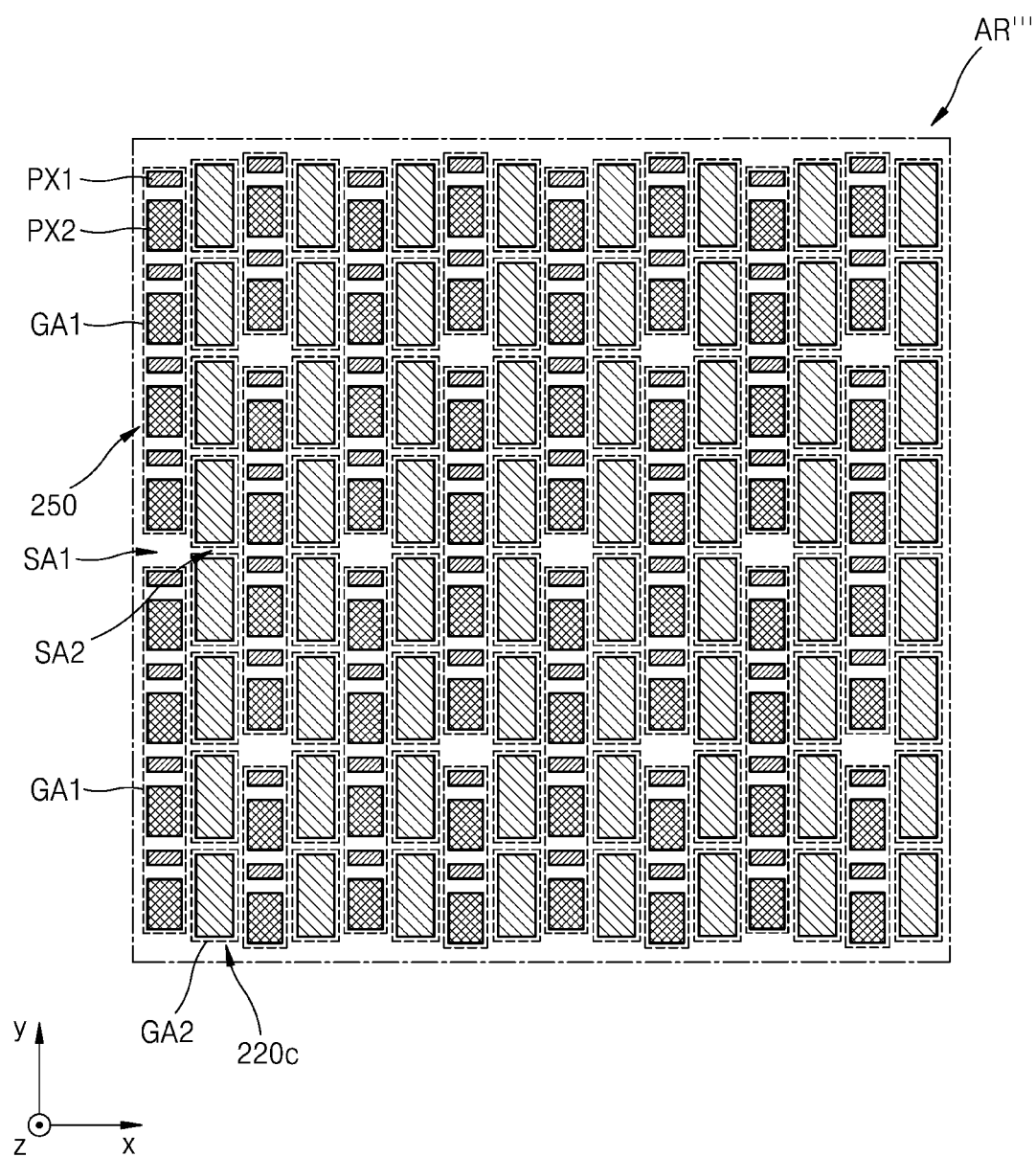
FIG. 12 is a schematic enlarged plan view of a display apparatus according to some embodiments.

FIGS. 11 and 12 are schematic enlarged plan views of a display apparatus according to some embodiments. Because the embodiments illustrated with respect to FIGS. 11 and 12 share characteristics of the embodiments described with respect to FIG. 3, the differences will be mainly described below, and some description of the same or similar elements may be omitted.

Referring to FIGS. 11 and 12, the display apparatus (see 1 in FIG. 1) may include a plurality of first group areas GA1 and a plurality of second group areas GA2.

A plurality of first pixels PX1 and a plurality of second pixels PX2 may be in each of the first group areas GA1. A plurality of third pixels PX3 may be in each of the second group areas GA2.

According to some embodiments, as illustrated in FIG. 11, four first pixels PX1 and four second pixels PX2 may be in each of the first group areas GA1, and two third pixels PX3 may be in each of the second group areas GA2. In this case, the third intermediate layers 220c apart from each other to correspond to the second group areas GA2 may overlap two third pixel electrodes (see 210c in FIG. 7).

According to some embodiments, as illustrated in FIG. 12, four first pixels PX1 and four second pixels PX2 may be in each of the first group areas GA1, and one third pixel PX3 may be in each of the second group areas GA2. In this case, the third intermediate layers 220c apart from each other to correspond to the second group areas GA2 may overlap one third pixel electrode (see 210c in FIG. 7).

Although FIGS. 11 and 12 illustrate that four first pixels PX1 and four second pixels PX2 are in each of the first group areas GA1, this is only an example. As illustrated in FIGS. 13 to 16, the number of first pixels PX1 and the number of second pixels PX2 in each of the first group areas GA1 may be variously changed.

The display apparatus 1 may include first separation areas SA1 between the first group areas GA1 and second separation areas SA2 between the second group areas GA2. The first separation areas SA1 may be between the first group areas GA1 adjacent to each other in the first direction (e.g., ±y direction), and the second separation areas SA2 may be between the second group areas GA2 adjacent to each other in the first direction (e.g., ±y direction).

According to some embodiments, as illustrated in FIGS. 11 and 12, the first separation area SA1 and the second separation area SA2 may be adjacent to each other in the second direction (e.g., ±x direction) in a plan view.

Although FIGS. 11 and 12 illustrate the first separation area SA1 and the second separation area SA2 are adjacent to each other in the second direction (e.g., ±x direction), this is only an example, and the first separation area SA1 and the second separation area SA2 may be variously arranged. For example, in a plan view, the first separation area SA1 and the second separation area SA2 may be shifted vertically.

Figure 13:
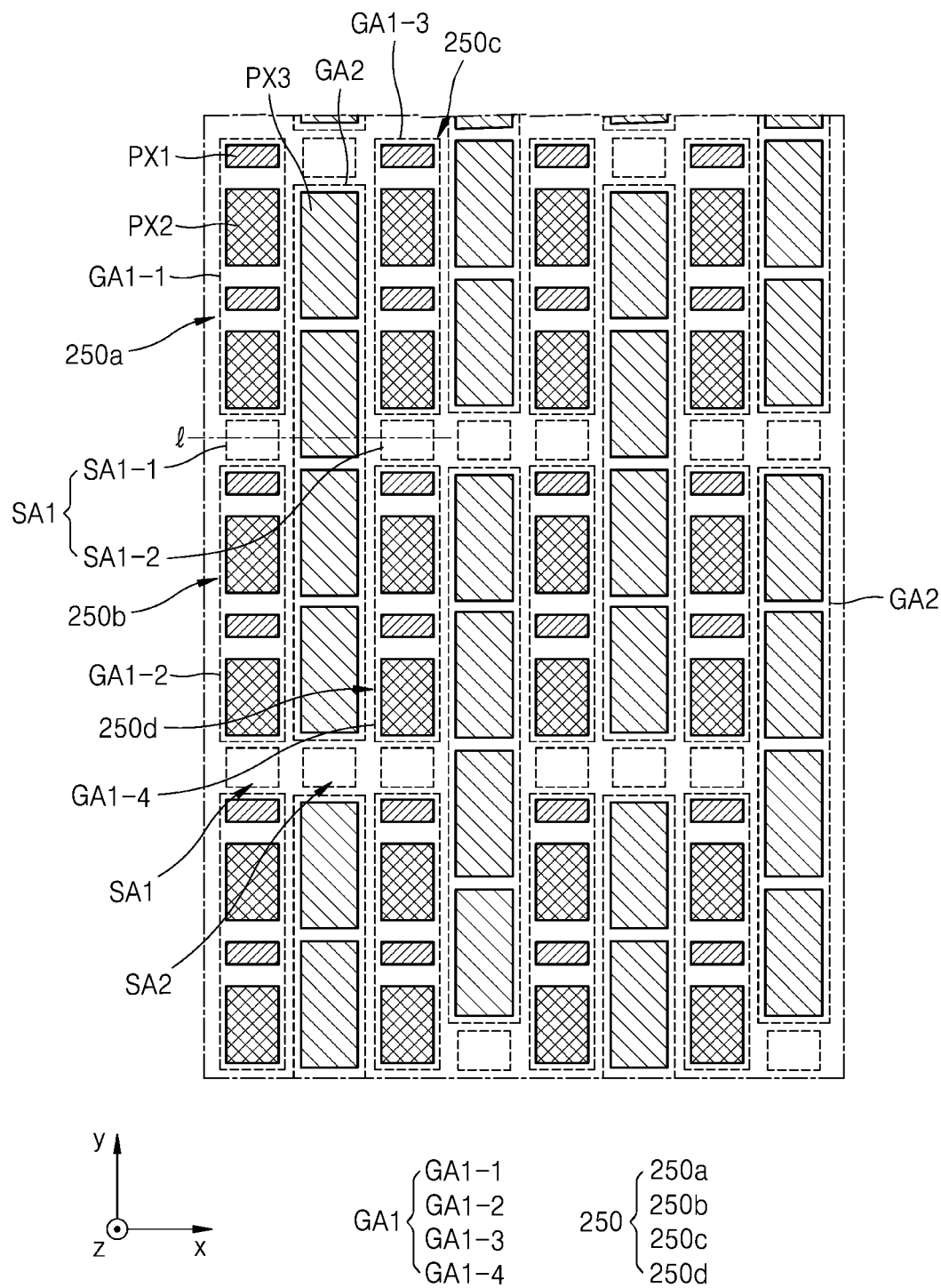
FIG. 13 is a schematic enlarged plan view of a display apparatus according to some embodiments.
Figure 14:
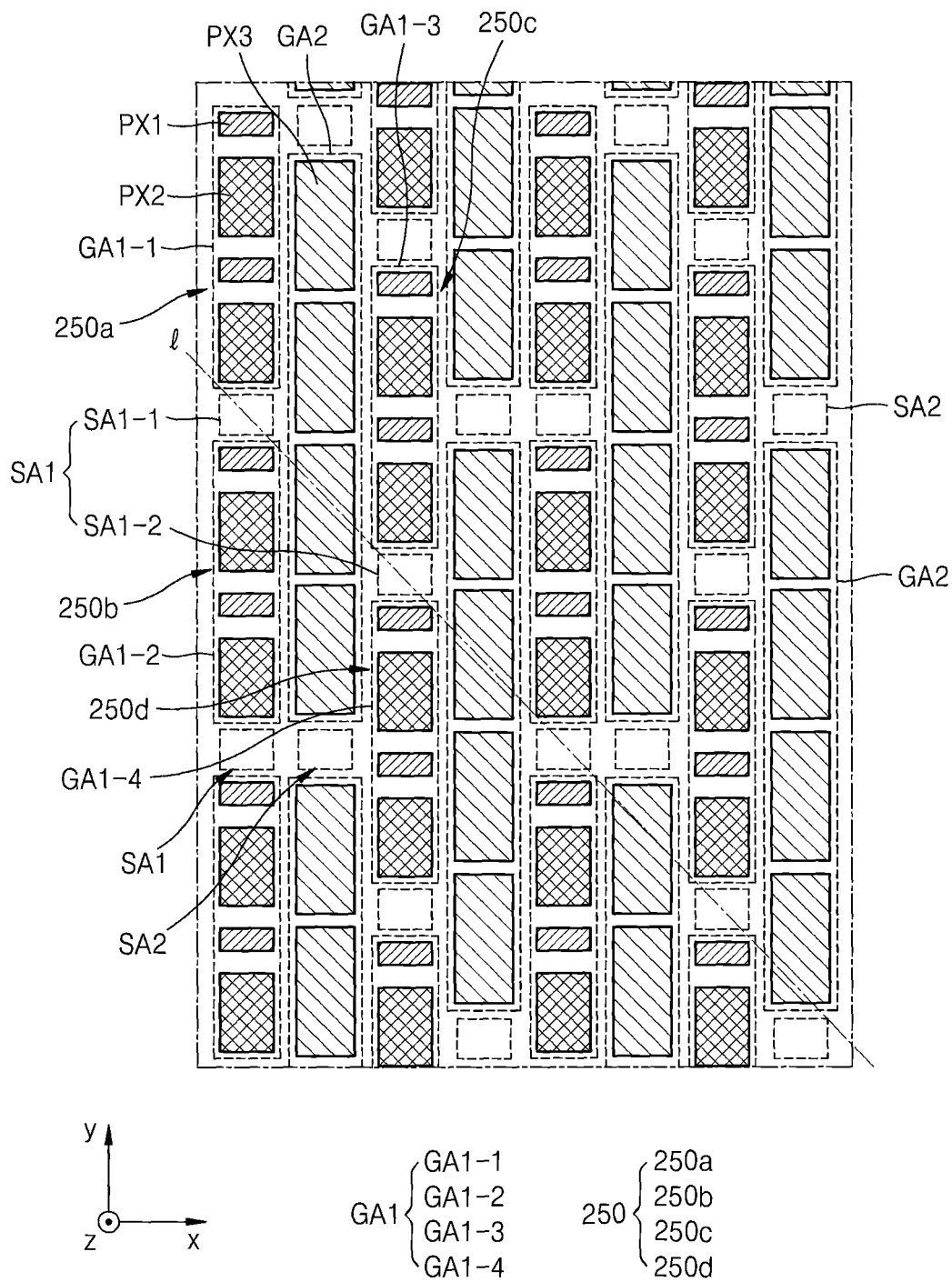
FIG. 14 is a schematic enlarged plan view of a display apparatus according to some embodiments.

FIGS. 13 and 14 are schematic enlarged plan views of a display apparatus according to some embodiments. Because the embodiments described with respect to FIGS. 13 and 14 share certain characteristics of the embodiments described with respect to FIG. 3, the differences will be mainly described below, and some description of the same or similar elements or components may be omitted.

Referring to FIGS. 13 and 14, the display apparatus (see 1 in FIG. 1) may include a plurality of first group areas GA1 and a plurality of second group areas GA2.

A plurality of first pixels PX1 and a plurality of second pixels PX2 may be in each of the first group areas GA1. A plurality of third pixels PX3 may be in each of the second group areas GA2.

According to some embodiments, as illustrated in FIGS. 13 and 14, two first pixels PX1 and two second pixels PX2 may be in each of the first group areas GA1, and four third pixels PX3 may be in each of the second group areas GA2. In this case, a plurality of first capping layers 250 apart from each other to correspond to the first group areas GA1 may overlap two first pixel electrodes (see 210a in FIG. 5) and two second pixel electrodes (see 210b in FIG. 5).

Although FIGS. 13 and 14 illustrate that four third pixels PX3 are in each of the second group areas GA2, one or two third pixels PX3 may be in each of the second group areas GA2, as illustrated in FIGS. 11 and 12. As another example, four or more third pixels PX3 may be in each of the second group areas GA2.

The display apparatus 1 may include first separation areas SA1 between the first group areas GA1 and second separation areas SA2 between the second group areas GA2. The first separation areas SA1 may be between the first group areas GA1 adjacent to each other in the first direction (e.g., ±y direction), and the second separation areas SA2 may be between the second group areas GA2 adjacent to each other in the first direction (e.g., ±y direction).

According to some embodiments, in a plan view, the first separation area SA1 and the second separation area SA2 may be adjacent to each other, as illustrated in FIG. 13. According to some embodiments, in a plan view, the first separation area SA1 and the second separation area SA2 may be adjacent to each other or may be shifted vertically, as illustrated in FIG. 14.

According to some embodiments, as illustrated in FIG. 13, a (1-1)th separation area SA1-1 between a (1-1)th group area GA1-1 and a (1-2)th group area GA1-2 adjacent to each other in the first direction (e.g., ±y direction) among the first group areas GA1 and a (1-2)th separation area SA1-2 between a (1-3)th group area GA1-3 and a (1-4)th group area GA1-4 adjacent to each other in the first direction (e.g., ±y direction) among the first group areas GA1 may be apart from each other in the second direction (e.g., ±x direction). A virtual line l connecting the (1-1)th separation area SA1-1 to the (1-2)th separation area SA1-2 may be parallel to the second direction (e.g., ±x direction).

In this case, the (1-1)th group area GA1-1 and the (1-3) group area GA1-3 may be parallel to each other in the second direction (e.g., ±x direction), and the (1-2)th group area GA1-2 and the (1-4)th group area GA1-4 may be parallel to each other in the second direction (e.g., ±x direction).

Because a plurality of first capping layers 250 may be arranged to correspond to the first group areas GA1, the same expression may be made using the first capping layers 250. That is, a (1-1)th separation area SA1-1 between a (1-1)th capping layer 250a and a (1-2)th capping layer 250b adjacent to each other in the first direction (e.g., ±y direction) among the first capping layers 250 and a (1-2)th separation area SA1-2 between a (1-3)th capping layer 250c and a (1-4)th capping layer 250d adjacent to each other in the first direction (e.g., ±y direction) among the first capping layers 250 may be apart from each other in the second direction (e.g., ±x direction). A virtual line l connecting the (1-1)th separation area SA1-1 to the (1-2)th separation area SA1-2 may be parallel to the second direction (e.g., ±x direction). The virtual line l connecting the (1-1)th separation area SA1-1 to the (1-2)th separation area SA1-2 may extend in the second direction (e.g., ±x direction).

According to some embodiments, as illustrated in FIG. 14, a (1-1)th separation area SA1-1 between a (1-1)th group area GA1-1 and a (1-2)th group area GA1-2 adjacent to each other in the first direction (e.g., ±y direction) among the first group areas GA1 and a (1-2)th separation area SA1-2 between a (1-3)th group area GA1-3 and a (1-4)th group area GA1-4 adjacent to each other in the first direction (e.g., ±y direction) among the first group areas GA1 may be apart from each other in a third direction crossing the first direction (e.g., ±y direction). A virtual line l connecting the (1-1)th separation area SA1-1 to the (1-2)th separation area SA1-2 may be parallel to the third direction. The virtual line l connecting the (1-1)th separation area SA1-1 to the (1-2)th separation area SA1-2 may extend in the third direction.

In this case, the (1-1)th group area GA1-1 and the (1-3) group area GA1-3 may be apart from each other or shifted vertically in the second direction (e.g., ±x direction), and the (1-2)th group area GA1-2 and the (1-4)th group area GA1-4 may be apart from each other or shifted vertically in the second direction (e.g., ±x direction). That is, the (1-1)th group area GA1-1 and the (1-3) group area GA1-3 may be apart from each other in the third direction, and the (1-2)th group area GA1-2 and the (1-4)th group area GA1-4 may be apart from each other in the third direction.

Because a plurality of first capping layers 250 may be arranged to correspond to the first group areas GA1, the same expression may be made using the first capping layers 250. That is, the (1-1)th separation area SA1-1 between a (1-1)th capping layer 250a and a (1-2)th capping layer 250b adjacent to each other in the first direction (e.g., ±y direction) among the first capping layers 250 and the (1-2)th separation area SA1-2 between a (1-3)th capping layer 250c and a (1-4)th capping layer 250d adjacent to each other in the first direction (e.g., ±y direction) among the first capping layers 250 may be apart from each other in the third direction crossing the first direction (e.g., ±y direction). A virtual line l connecting the (1-1)th separation area SA1-1 to the (1-2)th separation area SA1-2 may be parallel to the third direction.

Also, as illustrated in FIG. 14, the first separation area SA1 may be in the center of the first group area GA1 arranged in the second direction (e.g., ±x direction). For example, the (1-2)th separation area SA1-2 between the (1-3)th group area GA1-3 and the (1-4)th group area GA1-4 may be parallel to the center of the (1-2)th group area GA1-2 in the second direction (e.g., ±x direction).

Although FIG. 14 illustrates that the first separation area SA1 is in the center of the first group area GA1 arranged in the second direction (e.g., ±x direction), this is only an embodiment and the first separation area SA1 may deviate from the center of the first group area GA1. That is, the first separation area SA1 illustrated in FIG. 14 may be positioned to move in parallel in the first direction (e.g., ±y direction).

Figure 15:
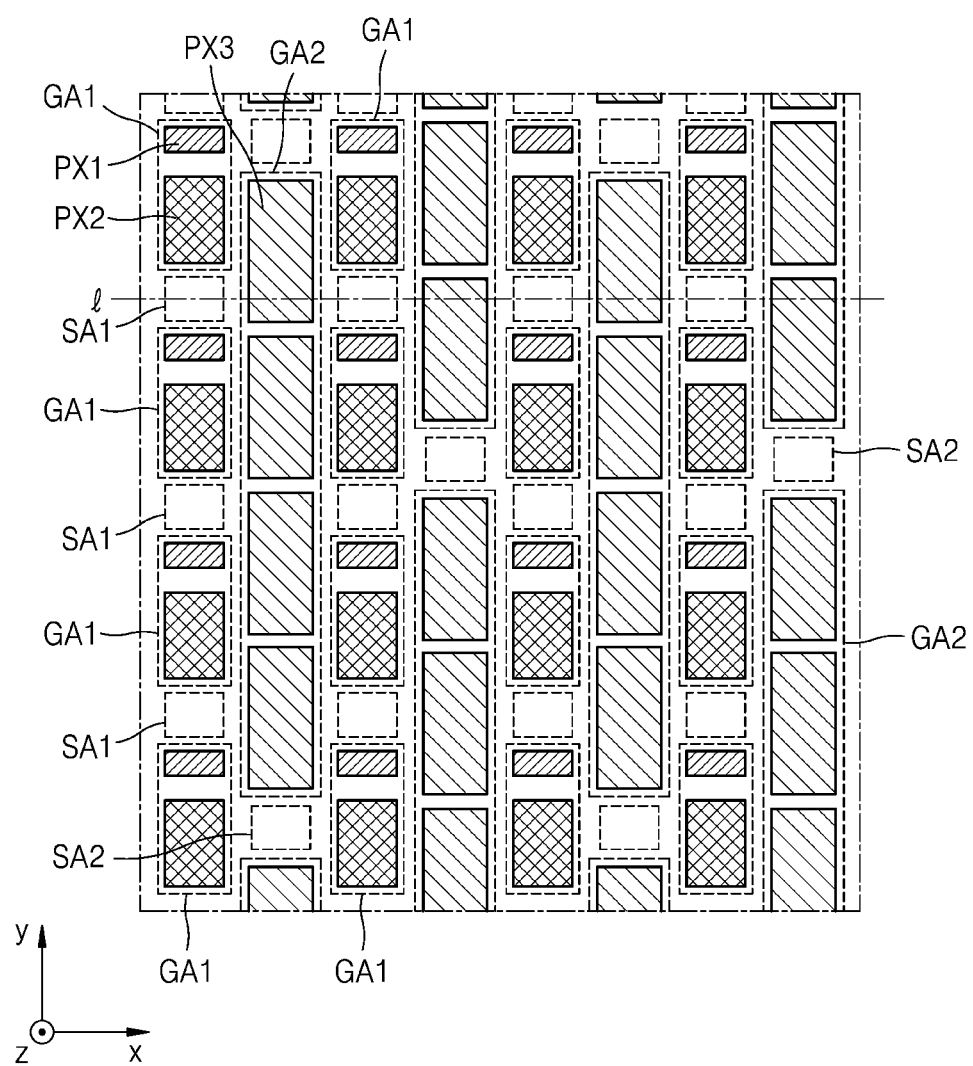
FIG. 15 is a schematic enlarged plan view of a display apparatus according to some embodiments.
Figure 16:
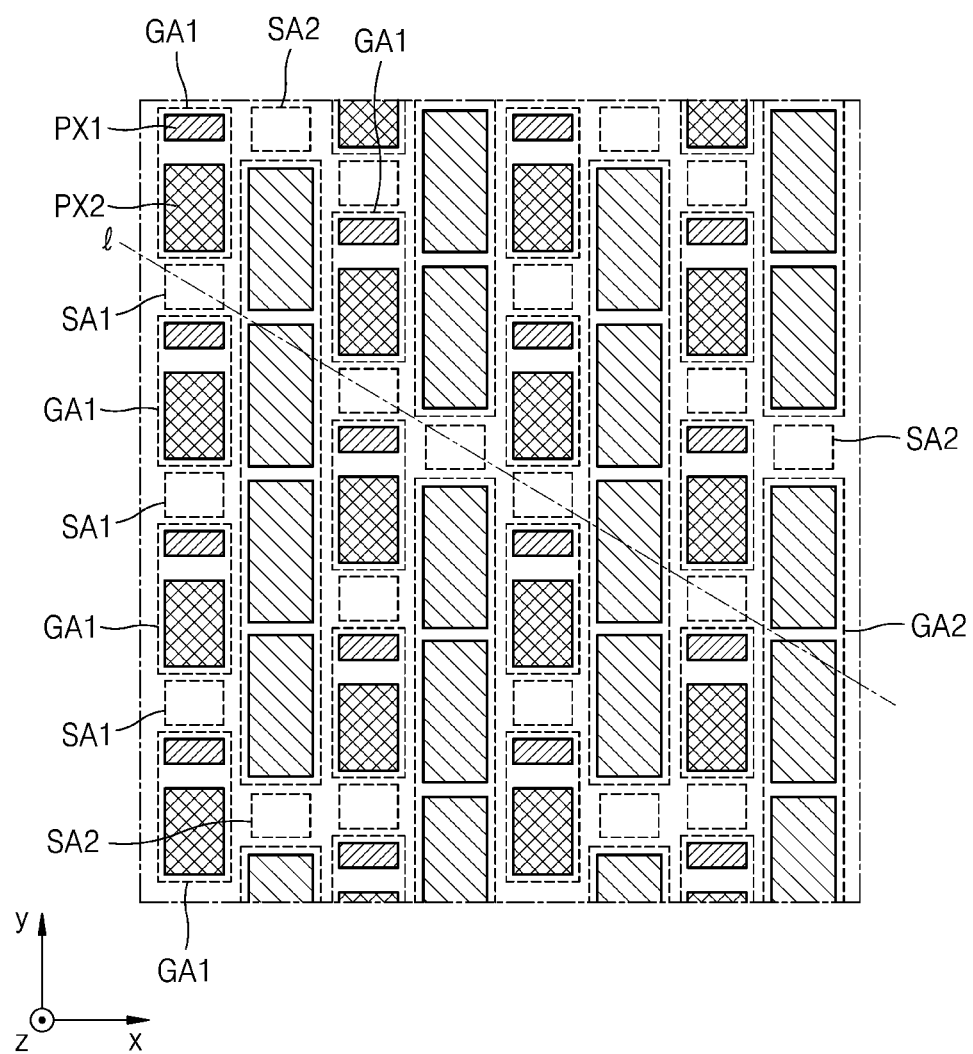
FIG. 16 is a schematic enlarged plan view of a display apparatus according to some embodiments.

FIGS. 15 and 16 are schematic enlarged plan views of a display apparatus according to some embodiments. Because the embodiments described with respect to FIGS. 15 and 16 share characteristics of the embodiments described with respect to FIG. 3, the differences will be mainly described below, and some description of the same or similar elements may be omitted.

Referring to FIGS. 15 and 16, the display apparatus (see 1 in FIG. 1) may include a plurality of first group areas GA1 and a plurality of second group areas GA2.

A plurality of first pixels PX1 and a plurality of second pixels PX2 may be in each of the first group areas GA1. A plurality of third pixels PX3 may be in each of the second group areas GA2.

According to some embodiments, as illustrated in FIGS. 15 and 16, one first pixel PX1 and one second pixel PX2 may be in each of the first group areas GA1, and four third pixels PX3 may be in each of the second group areas GA2. In this case, a plurality of first capping layers 250 apart from each other to correspond to the first group areas GA1 may overlap one first pixel electrode (see 210a in FIG. 5) and one second pixel electrode (see 210b in FIG. 5).

Although FIGS. 15 and 16 illustrate that four third pixels PX3 are in each of the second group areas GA2, one or two third pixels PX3 may be in each of the second group areas GA2, as illustrated in FIGS. 11 and 12. As another example, four or more third pixels PX3 may be in each of the second group areas GA2.

The display apparatus 1 may include first separation areas SA1 between the first group areas GA1 and second separation areas SA2 between the second group areas GA2. The first separation areas SA1 may be between the first group areas GA1 adjacent to each other in the first direction (e.g., ±y direction), and the second separation areas SA2 may be between the second group areas GA2 adjacent to each other in the first direction (e.g., ±y direction).

According to some embodiments, in a plan view, the first separation areas SA1 arranged in different columns from each other may be adjacent to each other, as illustrated in FIG. 15. For example, a virtual line l connecting the first separation areas SA1 arranged in different columns from each other may be parallel to the second direction (e.g., ±x direction).

In this case, the first group areas GA1 arranged in different columns from each other may be parallel to the second direction (e.g., ±x direction). Although the above description has been given focusing on the first group areas GA1, the first capping layers 250 may be arranged to correspond to the first group areas GA1, and thus, the same may apply to the first capping layers 250.

According to some embodiments, in a plan view, the first separation areas SA1 arranged in different columns from each other may be shifted vertically, as illustrated in FIG. 16. For example, a virtual line l connecting the first separation areas SA1 arranged in different columns from each other may be parallel to the third direction crossing the first direction (e.g., ±y direction) and the second direction (e.g., ±x direction). The virtual line l connecting the first separation areas SA1 arranged in different columns from each other may be parallel to the diagonal direction.

In this case, the first group areas GA1 arranged in different columns from each other may be apart from each other or shifted vertically in the second direction (e.g., ±x direction). That is, the first group areas GA1 arranged in different columns from each other may be apart from each other in the third direction. Although the above description has been given focusing on the first group areas GA1, the first capping layers 250 may be arranged to correspond to the first group areas GA1, and thus, the same may apply to the first capping layers 250.

Also, as illustrated in FIG. 16, the first separation area SA1 may be in the center of the first group area GA1 arranged in the second direction (e.g., ±x direction).

Although FIG. 16 illustrates that the first separation area SA1 is in the center of the first group area GA1 arranged in the second direction (e.g., ±x direction), this is only an embodiment and the first separation area SA1 may deviate from the center of the first group area GA1. That is, the first separation area SA1 illustrated in FIG. 16 may be positioned to move in parallel in the first direction (e.g., ±y direction).

Figure 17:
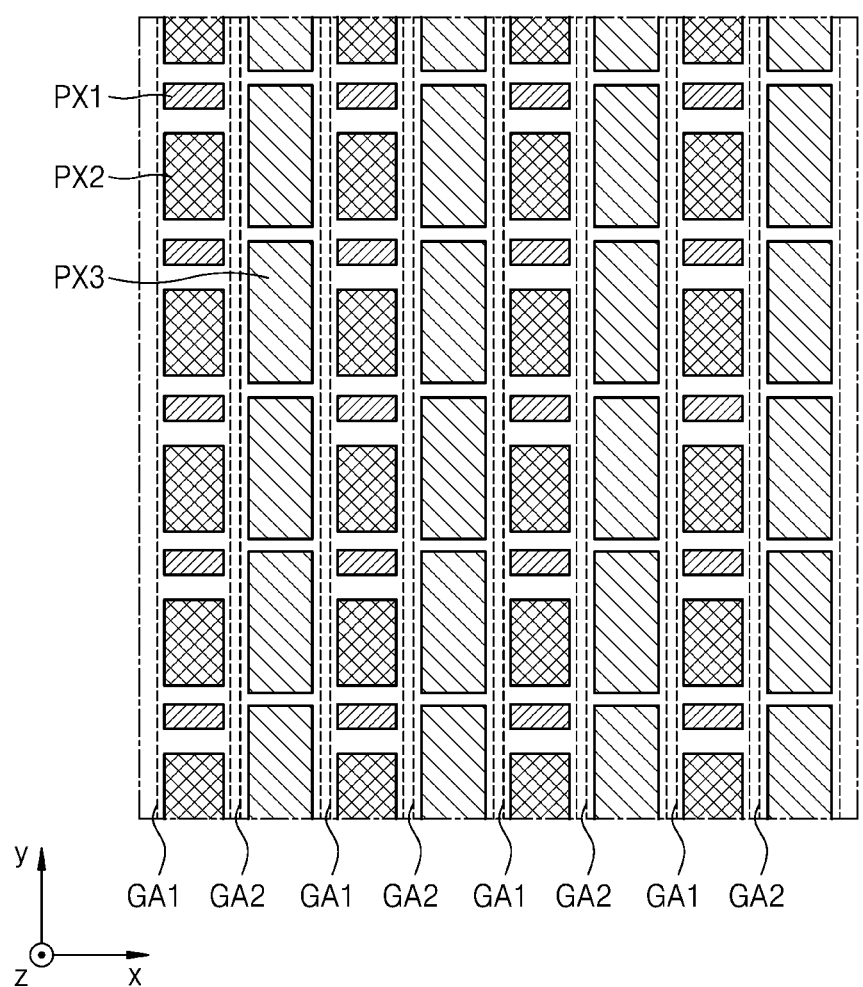
FIG. 17 is a schematic enlarged plan view of a display apparatus according to some embodiments.

FIG. 17 is a schematic enlarged plan view of a display apparatus according to some embodiments. Because the embodiments described with respect to FIG. 17 share characteristics of the embodiments described with respect to FIG. 3, the differences will be mainly described below, and the description of the same or similar components may be omitted.

Referring to FIG. 17, the display apparatus (see 1 in FIG. 1) may include a plurality of first group areas GA1 and a plurality of second group areas GA2.

The first group areas GA1 and the second group areas GA2 may be apart from each other. The first group areas GA1 and the second group areas GA2 may be alternately arranged in the row direction (e.g., ±x direction). For example, as illustrated in FIG. 17, the second group areas GA2 may be between the first group areas GA1 that are apart in the row direction (e.g., ±x direction).

A plurality of first pixels PX1, a plurality of second pixels PX2, and a plurality of third pixels PX3 may be on the substrate (see 100 in FIG. 3) of the display apparatus (see 1 in FIG. 3). The first pixels PX1, the second pixels PX2, and the third pixels PX3 may be arranged in a matrix form. In this case, the first pixels PX1 and the second pixels PX2 arranged in the corresponding column may be in each of the first group areas GA1. Third pixels PX3 arranged in the corresponding column may be in each of the second group areas GA2. In other words, each of the first group areas GA1 may include the first pixels PX1 and the second pixels PX2 arranged in the corresponding column. Each of the second group areas GA2 may include the third pixels PX3 arranged in the corresponding column.

Each of the first pixel PX1, the second pixel PX2, and the third pixel PX3 may include the first pixel electrode (see 210a in FIG. 9), the second pixel electrode (see 210b in FIG. 9), and the third pixel electrode (see 210c in FIG. 9). The first pixel electrodes 210a, the second pixel electrodes 210b, and the third pixel electrodes 210c on the substrate 100 of the display apparatus 1 may be arranged to correspond to the first pixel PX1, the second pixel PX2, and the third pixel PX3, respectively. The first pixel electrodes 210a, the second pixel electrodes 210b, and the third pixel electrodes 210c may be arranged in a matrix form. In this case, the first pixel electrodes 210a and the second pixel electrodes 210b arranged in the corresponding column may be in each of the first group areas GA1. Third pixel electrodes 210c arranged in the corresponding column may be in each of the second group areas GA2. In other words, each of the first group areas GA1 may include the first pixel electrodes 210a and the second pixel electrodes 210b arranged in the corresponding column. Each of the second group areas GA2 may include the third pixel electrodes 210c arranged in the corresponding column.

The first group areas GA1 and the second group areas GA2 may extend in the column direction (e.g., ±y direction), and the first group areas GA1 and the second group areas GA2 may be arranged in the corresponding column. Unlike the embodiments described above with reference to FIGS. 3 to 16, the first group areas GA1 apart from each other in the column direction (e.g., ±y direction) may not be present, and the separation areas between the first group areas GA1 apart from each other in the column direction (e.g., ±y direction) may not be present.

On the other hand, as described above with reference to FIG. 9, the first capping layer 250 and the second capping layer 240 may be in the first group area GA1, and the second capping layer 240 may be in the second group area GA2.

Therefore, the total thickness of the capping layer in the first group area GA1 may be greater than the total thickness of the capping layer in the second group area GA2.

Only the display apparatus has been mainly described, but the disclosure is not limited thereto. For example, it will be understood that a method of manufacturing the display apparatus also falls within the scope of the disclosure.

Figure 18D:
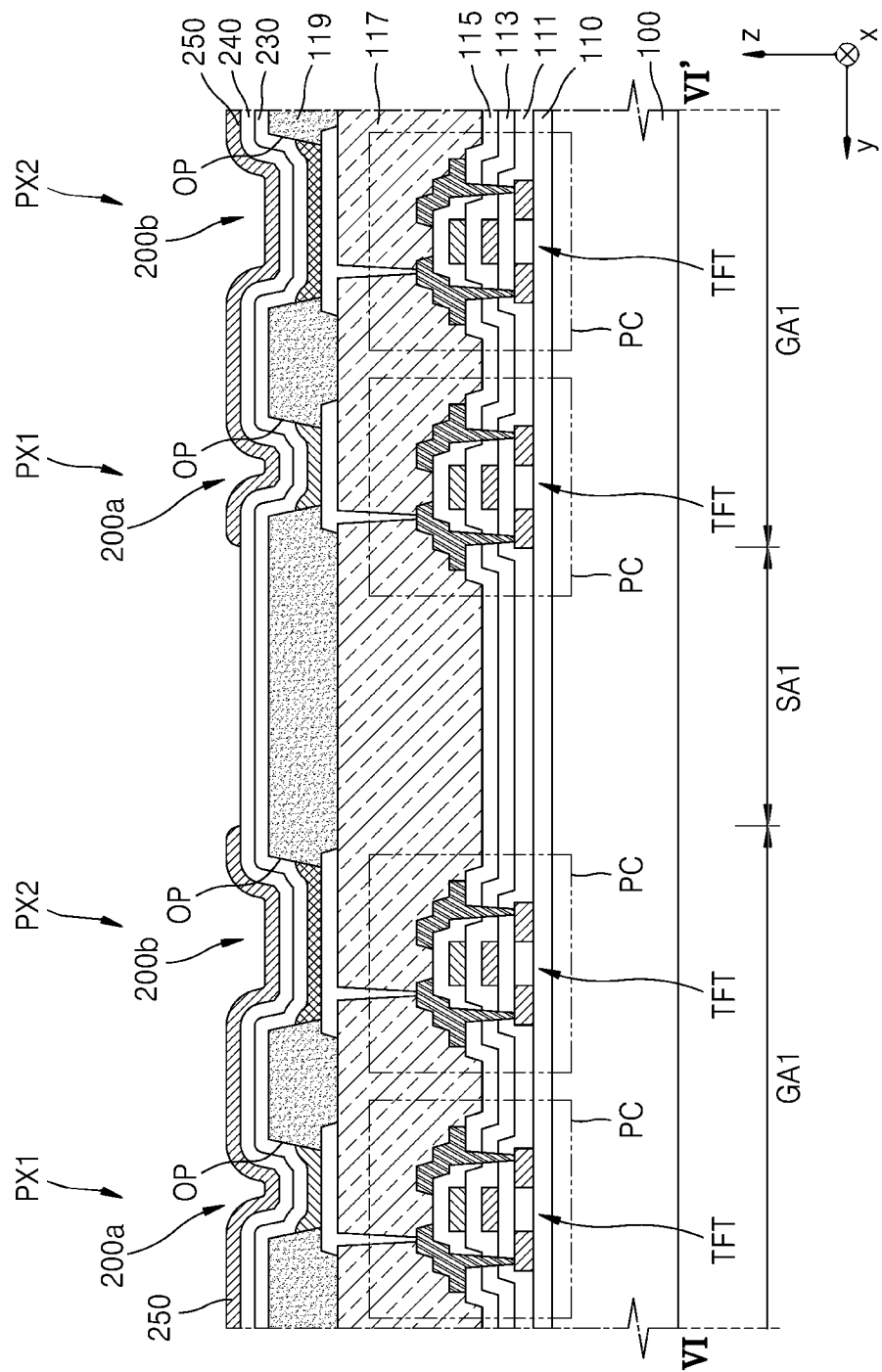

FIG. 18A is a schematic plan view illustrating an example of a mask for forming a first capping layer, and FIGS. 18B to 18D are cross-sectional views sequentially illustrating a method of manufacturing a display apparatus, according to some embodiments. For example, FIGS. 18B to 18D illustrate a process of forming a first capping layer in a first group area.

Referring to FIG. 18A, a first mask M1 for forming a first capping layer 250 may have a plurality of openings MOP1. The openings MOP1 may correspond to the first group areas GA1 described above with reference to FIG. 3.

A first rib r1 may be between the openings MOP1 adjacent to each other in a first direction (e.g., ±y direction). Because the openings MOP1 correspond to the first group areas GA1, the first rib r1 may correspond to a first separation area SA1 between the first group areas GA1 adjacent to each other in the first direction (e.g., ±y direction).

Referring to FIG. 18B, prior to the formation of the first capping layer 250, a thin-film transistor TFT, first and second pixel electrodes 210a and 210b, first and second intermediate layers 220a and 220b, an opposite electrode 230, and a second capping layer 240 may be formed.

First, a buffer layer 110, a semiconductor layer A, first and second gate insulating layers 111 and 113, a gate electrode G, a lower electrode CE1 and an upper electrode CE2 of a storage capacitor Cst, an interlayer insulating layer 115, and a planarization layer 117 are sequentially formed on a substrate 100.

The substrate 100 may include a glass material, a ceramic material, a metal material, or a flexible or bendable material. The substrate 100 may have a single-layer structure or a multilayer structure. When the substrate 100 has a multilayer structure, the substrate 100 may further include an inorganic layer. According to some embodiments, the substrate 100 may have an organic/inorganic/organic structure.

The buffer layer 110 may include silicon oxide ($SiO_2$) or silicon nitride ($SiN_x$), and may be formed by vapor deposition such as chemical vapor deposition (CVD) or sputtering.

The semiconductor layer A may be on the buffer layer 110. The semiconductor layer A may be formed by patterning a preliminary semiconductor layer. The preliminary semiconductor layer may include amorphous silicon or oxide semiconductor, and may be deposited by CVD. Also, when the preliminary semiconductor layer includes an amorphous silicon layer, the preliminary semiconductor layer may be formed and then crystallized into a polycrystalline silicon layer by various methods such as rapid thermal annealing (RTA), solid phase crystallization (SPC), excimer laser annealing (ELA), metal induced crystallization (MIC), metal induced lateral crystallization (MILC), and sequential lateral solidification (SLS).

According to some embodiments, the semiconductor layer A may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel region, and a source region and a drain region on both sides of the channel region. The semiconductor layer A may include a single layer or multiple layers.

The first and second gate insulating layer 111 and 113 may be stacked on the substrate 100 to cover the semiconductor layer A. The first and second gate insulating layers 111 and 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO), and may be formed by a deposition method such as CVD or sputtering, but the disclosure is not limited thereto.

A gate electrode G may be on the first gate insulating layer 111 to overlap at least a portion of the semiconductor layer A. The gate electrode G may include molybdenum (Mo), aluminum (Al), copper (Cu), titanium (Ti), and the like, and may include a single layer or multiple layers. For example, the gate electrode G may include a single Mo layer.

The lower electrode CE1 of the storage capacitor Cst may be on the first gate insulating layer 111 and may include the same material as that of the gate electrode G. The upper electrode CE2 of the storage capacitor Cst overlaps the lower electrode CE1 with the second gate insulating layer 113 therebetween to form a capacitor. In this case, the second gate insulating layer 113 may function as a dielectric layer of the storage capacitor Cst.

In order to form the gate electrode G and the lower electrode CE1 of the storage capacitor Cst, a metal layer may be formed on the entire surface of the substrate 100 and then patterned. The metal layer may be formed by a deposition method such as CVD, plasma enhanced CVD (PECVD), low pressure CVD (LPCVD), physical vapor deposition (PVD), sputtering, or atomic layer deposition (ALD), but the disclosure is not limited thereto. The method of forming the upper electrode CE2 of the storage capacitor Cst may be the same as the method of forming the gate electrode G and the lower electrode CE1 of the storage capacitor Cst.

An interlayer insulating layer 115 may be formed on the entire surface of the substrate 100 to cover the upper electrode CE2 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO), and may be formed by a deposition method such as CVD or sputtering, but the disclosure is not limited thereto.

Contact holes are formed to pass through the first and second gate insulating layers 111 and 113 and the interlayer insulating layer 115 and expose the source region and/or the drain region of the semiconductor layer A.

The source electrode S and the drain electrode D may include a conductive material including molybdenum (Mo), aluminum (Al), copper (Cu), titanium (Ti), and the like, and may include a single layer or multiple layers including the above-described material. For example, the source electrode S and the drain electrode D may have a multilayer structure of Ti/Al/Ti. The source electrode S and the drain electrode D may be connected to the source region or the drain region of the semiconductor layer A through the contact holes.

A planarization layer 117 may be arranged on the interlayer insulating layer 115 to cover the source electrode S and drain electrode D. The planarization layer 117 may include a single layer or multiple layers including an organic material or an inorganic material. The planarization layer 117 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, or any blend thereof. The planarization layer 118 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). After the planarization layer 117 is formed, chemical mechanical polishing may be performed on the planarization layer 117 to provide a flat upper surface.

First and second pixel electrodes 210a and 210b are formed on the planarization layer 117. The first and second pixel electrodes 210a and 210b may be formed by depositing a conductive layer on the entire upper surface of the planarization layer 117 and performing a mask process and an etching process on the conductive layer.

Because the contact hole exposing the drain electrode D is formed in the planarization layer 117, the first and second pixel electrodes 210a and 210b may be connected to the drain electrode D through the contact hole.

A pixel defining layer 119 including openings OP covering edges of the first and second pixel electrodes 210a and 210b and exposing a central portion is formed on the entire upper surface of the planarization layer 117. The pixel defining layer 119 may include at least one organic insulating material selected from polyimide, polyamide, acrylic resin, benzocyclobutene, and phenol resin and may be formed by spin coating or the like.

First and second intermediate layers 220a and 220b are formed in the openings OP of the pixel defining layer 119, respectively. The first and second intermediate layers 220a and 220b may include a low molecular weight material or a high molecular weight material. The first and second intermediate layers 220a and 220b may be formed by vacuum deposition, screen printing or inkjet printing, laser induced thermal imaging (LITI), or the like.

An opposite electrode 230 is formed to correspond to the first and second intermediate layers 220a and 220b. The opposite electrode 230 may be formed to cover the display area (see DA in FIG. 1) of the substrate 100 through an open mask. The opposite electrode 230 may be formed by a deposition method such as CVD, PECVD, LPCVD, PVD, sputtering, or ALD.

A second capping layer 240 is formed to correspond to the opposite electrode 230. The second capping layer 240 may be formed to cover the display area DA of the substrate 100 through an open mask. The second capping layer 240 may be formed by various methods such as vacuum deposition, spin coating, casting, or an LB method.

The second capping layer 240 may include an organic material, an inorganic material, or any mixture thereof. Examples of the organic material may include at least one selected from tris-8-hydroxyquinoline aluminum (Alq3), ZnSe, 2,5-bis(6'-(2',2"-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4,4'-diamine (TPD), 1,1'-bis(di-4-tolylaminophenyl) cyclohexane (TAPC), triaryl amine derivative (EL301), 8-quinolinolato lithium (Liq), N(diphenyl-) 4-yl)9,9-dimethyl-N-(4(9-phenyl-9H-carbazol-3-yl)phenyl)-9H-fluorene-2-amine(HT211), and 2-(4-(9,10-di(naphthalene-2-yl) anthracene-2-yl)phenyl)-1-phenyl-1H-benzo-[D]imidazole (LG201). Examples of the inorganic material may include at least one selected from ITO, IZO, $SiO_2$, $SiN_x$, $Y_2O_3$, $WO_3$, $MoO_3$, and $Al_2O_3$.

Referring to FIGS. 18C and 18D, a first capping layer 250 is formed on the second capping layer 240 by using the first mask M1 illustrated in FIG. 18A. The first capping layer 250 may be formed by various methods such as vacuum deposition, spin coating, casting, or an LB method.

As illustrated in FIG. 18C, when the first capping layer 250 is formed by using the first mask M1 having the openings MOP1, a portion of the deposition material forming the first capping layer 250 may pass through the openings MOP1 and reach the second capping layer 240. Unlike this, because another portion of the deposition material forming the first capping layer 250 do not pass through the first rib r1 between the openings MOP1, the deposition material may not reach the second capping layer 240 corresponding to the first rib r1.

As a result, as illustrated in FIG. 18D, the first capping layer 250 may be partially formed on the second capping layer 240. The first capping layer 250 may be formed on the first group areas GA1 corresponding to the openings MOP1, and the first capping layer 250 may not be formed on the first separation area SA1 between the first group areas GA1 corresponding to the first rib r1.

FIGS. 18B to 18D illustrate that the upper surface of the substrate 100 is arranged to face the +z direction, and then, the thin-film transistor TFT, the first and second pixel electrodes 210a and 210b, the first and second intermediate layers 220a and 220b, the opposite electrode 230, the second capping layer 240, and the first capping layer 250 are formed, but the upper surface of the substrate 100 may be arranged to face in the −z direction according to a process condition. For example, in forming the first capping layer 250 and the second capping layer 240, the upper surface of the substrate 100 may be arranged to face the −z direction, and a linear motor or the like may be arranged to face the substrate 100. The deposition material emitted from the linear motor or the like may travel in the +z direction and may be deposited on the upper surface of the opposite electrode 230.

Figure 19C:
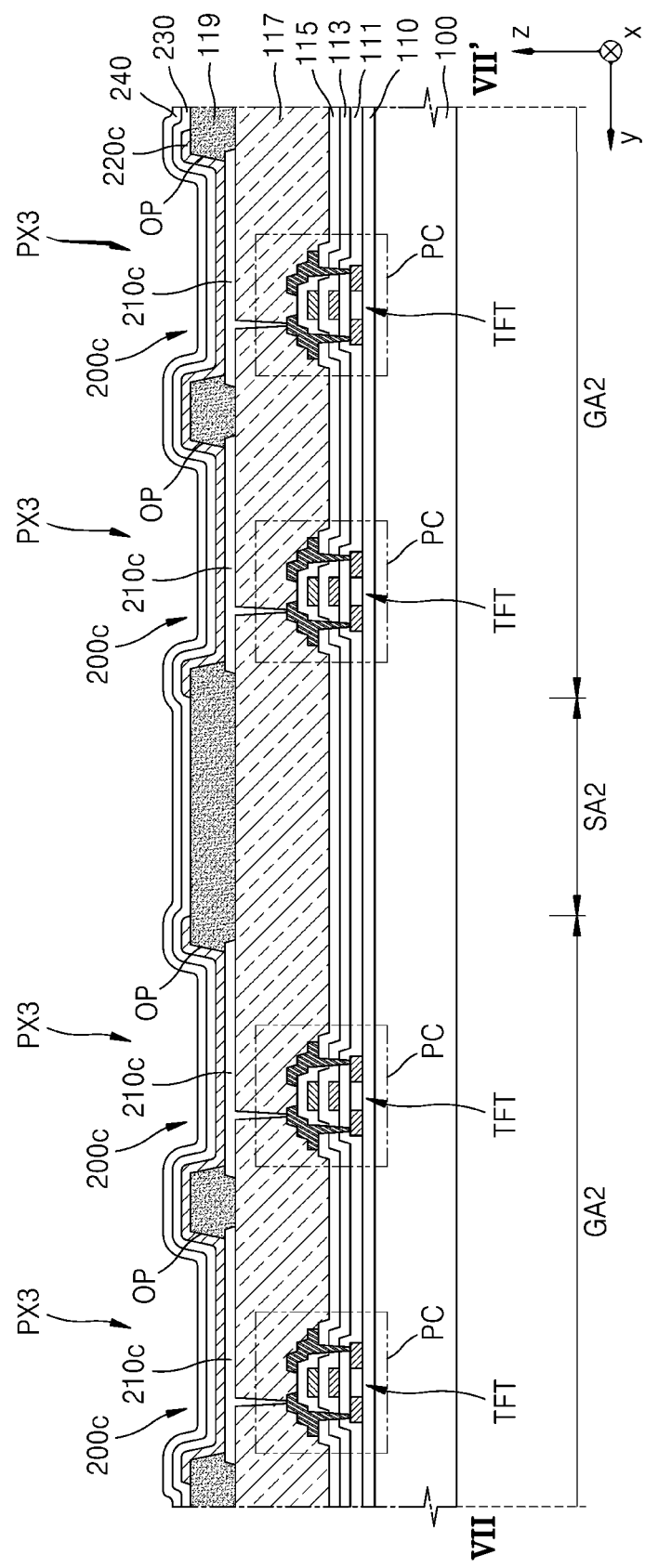

FIG. 19A is a schematic plan view illustrating an example of a mask for forming a third intermediate layer, and FIGS. 19B and 19C are cross-sectional views sequentially illustrating a method of manufacturing a display apparatus, according to some embodiments. For example, FIGS. 19B and 19C illustrate a process of forming a third intermediate layer in a second group area.

Referring to FIG. 19A, a second mask M2 for forming a third intermediate layer 220c may have a plurality of openings MOP2. The openings MOP2 may correspond to the second group areas GA2 described above with reference to FIG. 3.

A second rib r2 may be between the openings MOP2 adjacent to each other in a first direction (e.g., ±y direction). Because the openings MOP2 correspond to the second group areas GA2, the second rib r2 may correspond to a second separation area SA2 between the second group areas GA2 adjacent to each other in the first direction (e.g., ±y direction).

Referring to FIGS. 19B and 19C, a third intermediate layer 220c is formed on the third pixel electrode 210c by using the second mask M2 illustrated in FIG. 19A. Prior to the formation of the third intermediate layer 220c, a thin-film transistor TFT and a third pixel electrode 210c may be formed, and the thin-film transistor TFT and the third pixel electrode 210c may be formed by the method described above with reference to FIG. 18B.

The third intermediate layer 220c may include a low molecular weight material or a high molecular weight material. The third intermediate layer 220c may be formed by vacuum deposition, screen printing or inkjet printing, LITI, or the like.

As illustrated in FIG. 19B, when the third intermediate layer 220c is formed by using the second mask M2 having the openings MOP2, a portion of the deposition material forming the third intermediate layer 220c may pass through the openings MOP2 and reach the third pixel electrode 210c. Unlike this, because another portion of the deposition material forming the third intermediate layer 220c do not pass through the second rib r2 between the openings MOP2, the deposition material may not reach the third pixel electrode 210c corresponding to the second rib r2.

As a result, as illustrated in FIG. 19C, the third intermediate layer 220c may be partially formed on the third pixel electrode 210c. The third intermediate layer 220c may be formed on the second group areas GA2 corresponding to the openings MOP2, and the third intermediate layer 220c may not be formed on the second separation area SA2 between the second group areas GA2 corresponding to the second rib r2.

FIGS. 19B and 19C illustrate that the upper surface of the substrate 100 is arranged to face the +z direction, and then, the third intermediate layer 220c is formed, but the upper surface of the substrate 100 may be arranged to face the −z direction according to a process condition. For example, in forming the third intermediate layer 220c, the upper surface of the substrate 100 may be arranged to face the −z direction, and a linear motor or the like may be arranged to face the substrate 100. The deposition material emitted from the linear motor or the like may travel in the +z direction and may be deposited on the upper surface of the third pixel electrode 210c.

According to some embodiments, the first capping layers 250 overlapping the first pixels PX1 and the second pixels PX2 emitting light of different colors from each other may be formed using a single mask. In this case, because a single mask is used even when the first pixels PX1 and the second pixels PX2 emit light of different wavelength bands from each other, the manufacturing process may be simplified and the manufacturing cost may be reduced.

In addition, according to some embodiments, the third intermediate layers 220c corresponding to the third pixels PX3 may be integrally formed. In this case, because the second separation area SA2 between the second group areas GA2 per unit area may be reduced, the space in which the third pixels PX3 may be arranged may be relatively widened. Therefore, the size of each of the third pixels PX3 may be increased. An aperture ratio of each of the third pixels PX3 may be increased.

As described above, according to one or more embodiments, the display apparatus and the method of manufacturing the same, in which manufacturing operations and costs may be reduced by reducing the number of deposition masks, may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a substrate having first group areas spaced apart from each other;
   first pixel electrodes and second pixel electrodes in each of the first group areas;
   first intermediate layers respectively on the first pixel electrodes;
   second intermediate layers respectively on the second pixel electrodes;
   a pixel defining layer on the first pixel electrodes and the second pixel electrodes, and defining first openings exposing at least a portion of each of the first pixel electrodes and second openings exposing at least a portion of each of the second pixel electrodes;
   an opposite electrode on the first intermediate layers, the second intermediate layers, and the pixel defining layer;
   a second capping layer on the opposite electrode; and
   first capping layers on the second capping layer, respectively extending across an entirety of the first group areas, spaced apart from each other to correspond to the first group areas, and entirely overlapping the first openings and the second openings.

2. The display apparatus of claim 1, wherein the first pixel electrodes and the second pixel electrodes are alternately arranged.

3. The display apparatus of claim 1, wherein the substrate further has second group areas spaced apart from each other, and
   wherein the display apparatus further comprises:
   a third pixel electrode in each of the second group areas;
   third intermediate layers on the third pixel electrode, and spaced apart from each other to respectively correspond to the second group areas; and
   wherein the second capping layer is on the third intermediate layers, and corresponding to the first group areas and the second group areas.

4. The display apparatus of claim 3, wherein the first group areas and the second group areas are alternately arranged in a row direction.

5. The display apparatus of claim 4, wherein the third pixel electrode has a plurality of third pixel electrodes,
   wherein the first pixel electrodes, the second pixel electrodes, and the third pixel electrodes are on the substrate in a matrix arrangement,
   wherein each of the first group areas comprises two or more of the first pixel electrodes and two or more of the second pixel electrodes in a corresponding column, and
   wherein each of the second group areas comprises two or more of the third pixel electrodes arranged in a corresponding column.

6. The display apparatus of claim 5, wherein the pixel defining layer is on the third pixel electrodes, and defines third openings exposing at least a portion of each of the third pixel electrodes,
   wherein a distance between a first opening and a second opening adjacent to each other in a first direction among the first openings, the second openings, and the third openings is less than a distance between a third opening and a fourth opening adjacent to each other in the first direction among the first openings, the second openings, and the third openings,
   wherein the first opening and the second opening are in a same second group area, and
   wherein the third opening and the fourth opening are in adjacent ones of the second group areas in the first direction, respectively.

7. The display apparatus of claim 3, wherein the first group areas and the second group areas are arranged in a first direction, and
   wherein the first group areas and the second group areas are alternately arranged in a second direction crossing the first direction.

8. The display apparatus of claim 7, wherein, in a plan view, a first separation area between the first group areas and a second separation area between the second group areas are adjacent to each other in the second direction.

9. The display apparatus of claim 7, wherein, in a plan view, a virtual line connecting a first separation area between the first group areas and a second separation area between the second group areas extends in a third direction crossing the first direction and the second direction.

10. The display apparatus of claim 3, wherein the first intermediate layers are configured to emit light of a first wavelength band, the second intermediate layers are configured to emit light of a second wavelength band, and one of the third intermediate layers is configured to emit light of a third wavelength band.

11. The display apparatus of claim 3, wherein portions of the second capping layer corresponding to the first group areas are between the opposite electrode and the first capping layers, respectively.

12. The display apparatus of claim 1, wherein the first group areas are arranged in a first direction and a second direction crossing the first direction,
wherein a first separation area between a (1-1)th group area and a (1-2)th group area adjacent to each other in the first direction among the first group areas, and a second separation area between a (1-3)th group area and a (1-4)th group area adjacent to each other in the first direction among the first group areas, are spaced apart from each other in the second direction,
wherein the (1-1)th group area and the (1-3)th group area are spaced apart from each other in the second direction, and
wherein the (1-2)th group area and the (1-4)th group area are spaced apart from each other in the second direction.

13. The display apparatus of claim 12, wherein the first direction is perpendicular to the second direction.

14. The display apparatus of claim 1, wherein the first capping layers are arranged in a first direction and a second direction crossing the first direction,
wherein a first separation area between a (1-1)th capping layer and a (1-2)th capping layer adjacent to each other in the first direction among the first capping layers and a second separation area between a (1-3)th capping layer and a (1-4)th capping layer adjacent to each other in the first direction among the first capping layers are spaced apart from each other in the second direction,
wherein the (1-1)th capping layer and the (1-3)th capping layer are spaced apart from each other in the second direction, and
wherein the (1-2)th capping layer and the (1-4)th capping layer are spaced apart from each other in the second direction.

15. The display apparatus of claim 14, wherein the first direction is perpendicular to the second direction.

16. A display apparatus comprising:
a substrate having a plurality of first group areas spaced apart from each other;
a first pixel electrode and a second pixel electrode in each of the plurality of first group areas;
a first intermediate layer on the first pixel electrode;
a second intermediate layer on the second pixel electrode;
an opposite electrode on the first intermediate layer and the second intermediate layer;
a plurality of first capping layers on the opposite electrode and spaced apart from each other to correspond to the plurality of first group areas; and
a pixel defining layer on a plurality of first pixel electrodes and a plurality of second pixel electrodes and defining a plurality of openings exposing at least a portion of each of the plurality of first pixel electrodes and the plurality of second pixel electrodes,
wherein the plurality of first group areas are arranged in a first direction,
wherein a distance between a first opening and a second opening adjacent to each other in the first direction among the plurality of openings is less than a distance between a third opening and a fourth opening adjacent to each other in the first direction among the plurality of openings,
wherein the first opening and the second opening are in a same first group area, and
wherein the third opening and the fourth opening are in first group areas adjacent to each other in the first direction among the plurality of first group areas, respectively.

17. A method of manufacturing a display apparatus, the method comprising:
preparing a substrate having first group areas spaced apart from each;
forming first pixel electrodes and second pixel electrodes in each of the first group areas;
forming first intermediate layers respectively on the first pixel electrodes;
forming second intermediate layers respectively on the second pixel electrodes;
forming a pixel defining layer on the first pixel electrodes and the second pixel electrodes,
forming first openings exposing at least a portion of each of the first pixel electrodes and second openings exposing at least a portion of each of the second pixel electrodes in the pixel defining layer,
forming an opposite electrode on the first intermediate layers and the second intermediate layers;
forming a second capping layer on the opposite electrode; and
forming, on the second capping layer, first capping layers extending across an entirety of the first intermediate layers, spaced apart from each other to correspond to the first group areas, entirely overlapping the first openings and the second openings.

18. The method of claim 17, wherein the forming of the first capping layers includes using a first mask defining openings, and
wherein the first mask defining the openings corresponds to the first group areas, respectively.

19. The method of claim 17, wherein the substrate further has a second group areas spaced apart from each other, and the method further comprises:
forming a third pixel electrode in each of the second group areas;
forming, on the third pixel electrode, third intermediate layers spaced apart from each other to correspond to the second group areas; and
wherein the second capping layer corresponds to the first group areas and the second group areas.

20. The method of claim 19, wherein the forming of the third intermediate layers includes using a second mask defining openings, and
wherein the second mask defining the openings corresponds to the second group areas, respectively.

21. The method of claim 19, wherein the first intermediate layers are configured to emit light of a first wavelength band, the second intermediate layers are configured to emit light of a second wavelength band, and one of the third intermediate layers is configured to emit light of a third wavelength band.

22. The method of claim 17, wherein the first pixel electrodes and the second pixel electrodes are alternately arranged.

* * * * *